(12) United States Patent
Lee et al.

(10) Patent No.: US 11,387,301 B2
(45) Date of Patent: Jul. 12, 2022

(54) DISPLAY APPARATUS AND METHOD OF MANUFACTURING THE SAME

(71) Applicant: SAMSUNG DISPLAY CO., LTD., Yongin-si (KR)

(72) Inventors: Jaehak Lee, Yongin-si (KR); Jongbaek Seon, Yongin-si (KR); Juncheol Shin, Yongin-si (KR); Jieun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/598,152

(22) Filed: Oct. 10, 2019

(65) Prior Publication Data

US 2020/0312933 A1 Oct. 1, 2020

(30) Foreign Application Priority Data

Mar. 29, 2019 (KR) .......................... 10-2019-0037311

(51) Int. Cl.
| | |
|---|---|
| *H01L 27/32* | (2006.01) |
| *H01L 51/00* | (2006.01) |
| *H01L 51/56* | (2006.01) |
| *H01L 51/52* | (2006.01) |

(52) U.S. Cl.
CPC ...... *H01L 27/3258* (2013.01); *H01L 27/3225* (2013.01); *H01L 51/0017* (2013.01); *H01L 51/5253* (2013.01); *H01L 51/56* (2013.01); *H01L 2227/323* (2013.01)

(58) Field of Classification Search
CPC ............ H01L 27/3225; H01L 27/3258; H01L 51/5253; H01L 51/56; H01L 51/0017; H01L 2227/323
See application file for complete search history.

(56) References Cited

U.S. PATENT DOCUMENTS

| 7,935,977 B2 | 5/2011 | Lee et al. |
|---|---|---|
| 8,947,627 B2 | 2/2015 | Rappoport et al. |

(Continued)

FOREIGN PATENT DOCUMENTS

| JP | 4752754 | 8/2011 |
|---|---|---|
| KR | 10-0859084 | 9/2008 |
| KR | 10-2017-0059864 | 5/2017 |

*Primary Examiner* — Vongsavanh Sengdara
(74) *Attorney, Agent, or Firm* — F. Chau & Associates, LLC

(57) ABSTRACT

A display apparatus includes: a substrate including a component area, a display area, and a middle area provided between the component area and the display area; a thin-film transistor arranged in the display area; a display element including a pixel electrode, an intermediate layer, and an opposite electrode, wherein the pixel electrode is electrically connected to the thin-film transistor; a first organic insulating layer, a second organic insulating layer, and a passivation layer sequentially stacked on each other between the thin-film transistor and the pixel electrode; and a groove arranged in the middle area, wherein the groove divides an organic material layer included in the intermediate layer, wherein the groove is provided in multiple layers including an organic layer and an inorganic layer, wherein the organic layer is arranged on the substrate, and the inorganic layer is stacked on the organic layer.

9 Claims, 23 Drawing Sheets

(56) References Cited

U.S. PATENT DOCUMENTS

| | | | |
|---|---|---|---|
| 2016/0204373 A1* | 7/2016 | Park | H01L 51/5253 |
| | | | 257/40 |
| 2017/0148856 A1* | 5/2017 | Choi | H01L 27/3258 |
| 2017/0288004 A1* | 10/2017 | Kim | H01L 51/5246 |
| 2018/0174515 A1* | 6/2018 | Joo | G09G 3/3233 |
| 2019/0051859 A1* | 2/2019 | Choi | H01L 27/3248 |
| 2019/0148672 A1* | 5/2019 | Seo | H01L 27/3234 |
| | | | 257/40 |
| 2019/0157614 A1 | 5/2019 | Choi et al. | |
| 2019/0288047 A1* | 9/2019 | Jeong | H01L 27/323 |

* cited by examiner

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2019-0037311, filed on Mar. 29, 2019, the Korean Intellectual Property Office, the disclosure of which is incorporated by reference herein in its entirety.

TECHNICAL FIELD

One or more exemplary embodiments of the present inventive concept relate to a display apparatus and a method of manufacturing the display apparatus, and more particularly, to a display apparatus including a component area in a display area, and a method of manufacturing the display apparatus.

DISCUSSION OF THE RELATED ART

Recently, the purposes of display apparatuses have diversified. In addition, as display apparatuses have become thinner and lighter, the display apparatuses have become more widely used.

As a size of a display area of the display apparatuses is expanded, various functions combined or linked with the display apparatuses may be added. According to the expansion of a size of the display area, various functions and features are being considered for incorporation into the display apparatuses, and research is being conducted about arrangements of various components in the display area of the display apparatuses.

SUMMARY

According to an exemplary embodiment of the present inventive concept, a display apparatus includes: a substrate including a component area, a display area, and a middle area provided between the component area and the display area; a thin-film transistor arranged in the display area; a display element including a pixel electrode, an intermediate layer, and an opposite electrode, wherein the pixel electrode is electrically connected to the thin-film transistor, wherein the intermediate layer is disposed on the pixel electrode, and wherein the opposite electrode is disposed on the intermediate layer; a first organic insulating layer, a second organic insulating layer, and a passivation layer sequentially stacked on each other between the thin-film transistor and the pixel electrode; and a groove arranged in the middle area, wherein the groove divides an organic material layer included in the intermediate layer, wherein the groove is provided in multiple layers including an organic layer and an inorganic layer, wherein the organic layer is arranged on the substrate, and the inorganic layer is stacked on the organic layer.

In an exemplary embodiment of the present inventive concept, the inorganic layer includes a portion protruding toward a center of the groove.

In an exemplary embodiment of the present inventive concept, the organic layer includes a first sub-lower layer and a second sub-lower layer, wherein the first sub-lower layer is a same layer as the second organic insulating layer and the second sub-lower layer is a same layer as the first organic insulating layer.

In an exemplary embodiment of the present inventive concept, an end of the second sub-lower layer adjacent to the groove is covered by the first sub-lower, layer.

In an exemplary embodiment of the present inventive concept, the inorganic layer is a same layer as the passivation layer.

In an exemplary embodiment of the present inventive concept, the display apparatus further includes a thin-film encapsulation layer covering the display area and the middle area on the substrate.

In an exemplary embodiment of the present inventive concept, the thin-film encapsulation layer includes a first inorganic encapsulation layer, a second inorganic encapsulation layer, and an organic encapsulation layer arranged between the first inorganic encapsulation layer and the second inorganic encapsulation layer.

In an exemplary embodiment of the present inventive concept, the first inorganic encapsulation layer covers an inner wall of the groove that partitions the organic layer and the inorganic layer, wherein the organic encapsulation layer fills an inner space of the groove, and wherein the second inorganic encapsulation layer covers an upper surface of the organic encapsulation layer.

In an exemplary embodiment of the present inventive concept, the intermediate layer includes a light-emitting layer, a hole transport layer, and an electron transport layer, wherein the light-emitting layer is disposed between the hole transport layer and the electron transport layer, and wherein the hole transport layer and the electron transport layer are extended and stacked on the inorganic layer.

In an exemplary embodiment of the present inventive concept, at least one of the hole transport layer or the electron transport layer is divided by the groove.

According to an exemplary embodiment of the present inventive concept, a method of manufacturing a display apparatus including: preparing a substrate including a component area, a display area, and a middle area provided between the component area and the display area; forming a thin-film transistor in the display area; sequentially stacking a first organic insulating layer, a second organic insulating layer, and a passivation layer on the thin-film transistor; forming a display element on the passivation layer, wherein the display element includes a pixel electrode, an intermediate layer, and an opposite electrode, wherein the pixel electrode is electrically connected to the thin-film transistor, and wherein the intermediate layer is disposed on the pixel electrode; and forming a groove in the middle area, wherein the groove divides an organic material layer included in the intermediate layer, wherein the forming of the groove includes: stacking an organic layer on the substrate and patterning an empty space in the organic layer, and stacking an inorganic layer on the organic layer and patterning an empty space in the inorganic layer.

In an exemplary embodiment of the present inventive concept, the forming of the groove includes removing a part of an inner wall of the organic layer, which forms the patterned empty space of the organic layer, by performing dry etching using oxygen plasma, wherein, by removing the part of the inner wall of the organic layer, a portion of the inorganic layer extending beyond the organic layer toward a center of the groove is formed.

In an exemplary embodiment of the present inventive concept, the organic layer includes a first sub-lower layer and a second sub-lower layer, wherein the first sub-lower layer is a same layer as the second organic insulating layer and the second sub-lower layer is a same layer as the first organic insulating layer.

In an exemplary embodiment of the present inventive concept, an end of the second sub-lower layer adjacent to the groove is covered by the first sub-lower layer In an exemplary embodiment of the present inventive concept, the inorganic layer is a same layer as the passivation layer.

In an exemplary embodiment of the present inventive concept, the method of further including forming a thin-film encapsulation layer covering the display area and the middle area on the substrate.

In an exemplary embodiment of the present inventive concept, the thin-film encapsulation layer includes a first inorganic encapsulation layer, a second inorganic encapsulation layer, and an organic encapsulation layer arranged between the first inorganic encapsulation layer and the second inorganic encapsulation layer.

In an exemplary embodiment of the present inventive concept, the first inorganic encapsulation layer covers an inner wall of the groove that partitions the organic layer and the inorganic layer, wherein the organic encapsulation layer fills an inner space of the groove, and wherein the second inorganic encapsulation layer covers an upper surface of the organic encapsulation layer.

In an exemplary embodiment of the present inventive concept, the intermediate layer includes a light-emitting layer, a hole transport layer, and an electron transport layer, wherein the light-emitting layer is disposed between the hole transport layer and the electron transport layer, and wherein the hole transport layer and the electron transport layer are extended and stacked on the inorganic layer.

In an exemplary embodiment of the present inventive concept, at least one of the hole transport layer or the electron transport layer is divided by the groove.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
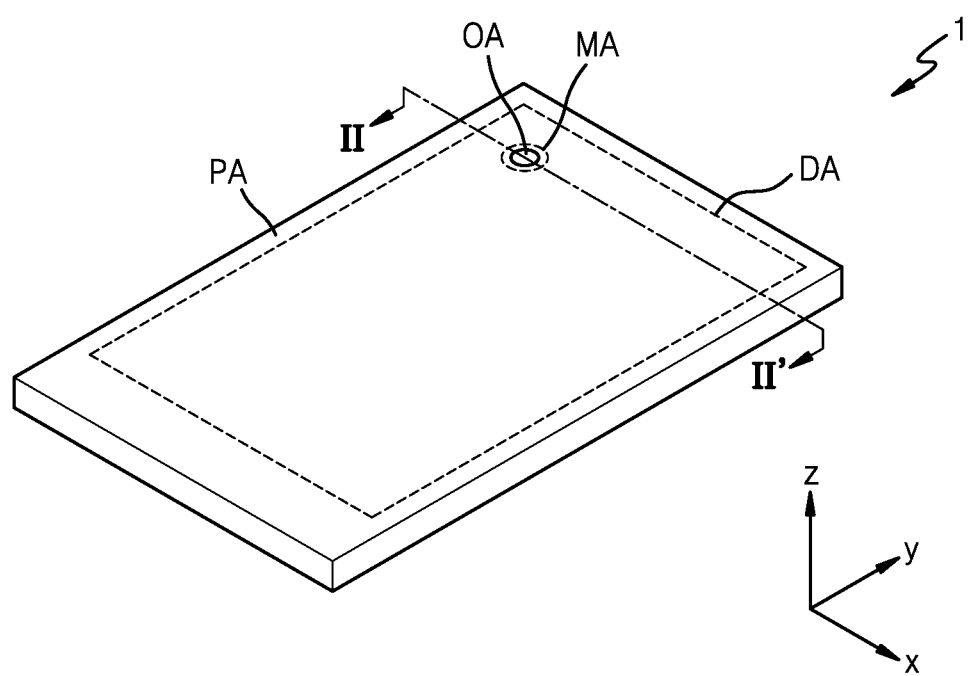
FIG. 1 is a perspective view of a display apparatus according to an exemplary embodiment of the present inventive concept.

Exemplary embodiments of the present inventive concept will now be described more fully with reference to the accompanying drawings. It is to be understood that the present inventive concept may be embodied in different forms and thus should not be construed as being limited to the exemplary embodiments set forth herein. It is to be understood that like reference numerals may refer to like elements throughout the specification, and thus redundant descriptions may be omitted. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These terms are only used to distinguish one component from another. Thus, a first component discussed below could be termed a second component without departing from the spirit and scope of the present inventive concept.

As used herein, the singular forms "a," "an" and "the" are intended to include the plural forms as well, unless the context clearly indicates otherwise.

Sizes of elements in the drawings may be exaggerated for clarity. In other words, since sizes and thicknesses of components in the drawings may be exaggerated for clarity, the following exemplary embodiments of the present inventive concept are not limited thereto.

When an exemplary embodiment of the present inventive concept may be implemented differently, a specific process order may be differently from a described order. For example, two processes that are consecutively described may be performed at substantially the same time or performed in an order opposite to the described order.

In this specification, "A and/or B" refers to A or B, or A and B. In addition, "at least one of A and B" refers to A or B, or A and B.

It will be understood that when a layer, region, or component is referred to as being "connected to" or "coupled to" another layer, region, or component, the layer, region, or component may be "directly connected or coupled" to the other layer, region, or component, or intervening layers, regions or components may be present therebetween. For example, when a layer, region, or component is referred to as being electrically "connected to" or "coupled to" another layer, region, or component, the layer, region or component may be electrically "directly connected or coupled" to the other layer, region, or component, and/or electrically "indirectly connected to" the other layer, region, or component with intervening elements therebetween.

FIG. 1 is a schematic perspective view of a display apparatus 1 according to an exemplary embodiment of the present inventive concept.

Referring to FIG. 1, the display apparatus 1 includes a component area OA and a display area DA. The component area OA is a first area and the display area DA is a second area at least partially surrounding the component area OA. The display apparatus 1 may provide a predetermined image by using light emitted from a plurality of pixels arranged in the display area DA. For example, the component area OA may be entirely surrounded by the display area DA. The component area OA may be an area in which a component is arranged. The component will be described later with reference to FIG. 2.

A middle area MA as a third area is arranged between the component area OA and the display area DA. The display area DA may be surrounded by a peripheral area PA that is a fourth area. The middle area MA and the peripheral area PA may be a type of non-display area in which pixels are not arranged. The middle area MA may be at least partially surrounded by the display area DA. For example, the display area DA may entirely be surrounded by the peripheral area PA.

Hereinafter, an organic light-emitting display apparatus is explained as an example of the display apparatus 1 according to an exemplary embodiment of the present inventive concept. However, the display apparatus 1 in the present disclosure is not limited to thereto. According to an exemplary embodiment of the present inventive concept, the display apparatus 1 in the present disclosure may be a display apparatus such as a quantum dot light-emitting display apparatus.

FIG. 1 shows that one component area OA is included, and the component area OA has a circular shape. However, the present inventive concept is not limited thereto. Two or more component areas OA may be included, and their respective shapes thereof may be variously modified to have a circular, oval, polygonal, star, a diamond shape, or the like.

Figure 2:
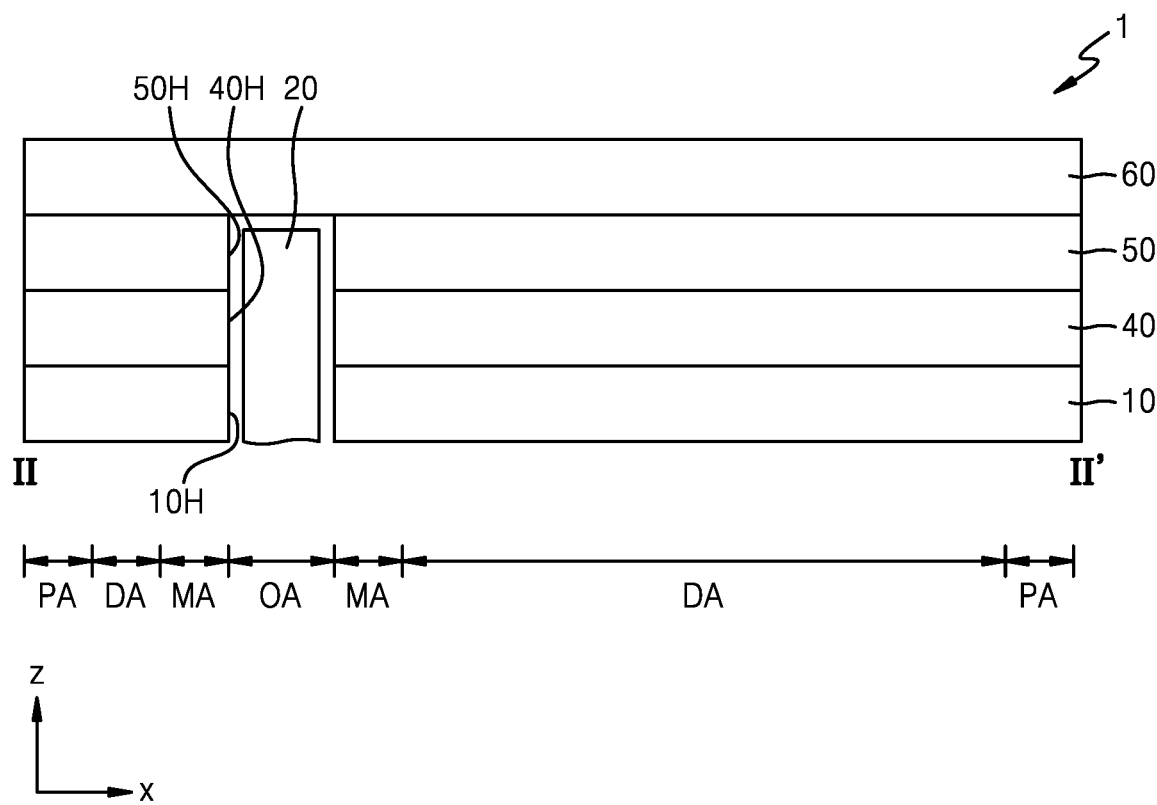
FIGS. 2 and 3 are cross-sectional views of the display apparatus taken along a line II-II' of FIG. 1.
Figure 3:
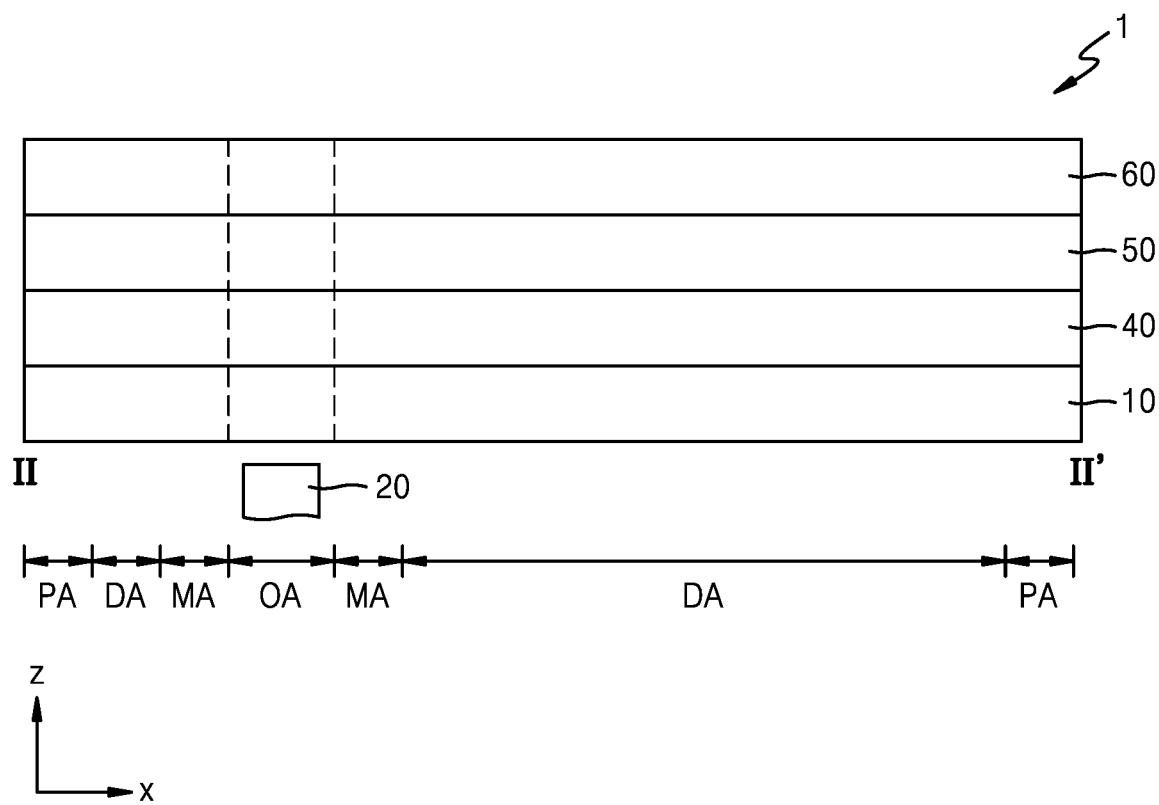

FIGS. 2 and 3 each are cross-sectional views of the display apparatus 1 according to an exemplary embodiment of the present inventive concept, which may correspond to a cross-section of the display apparatus 1 taken along line II-II'.

Referring to FIG. 2, the display apparatus 1 may include a display panel 10, an input detection layer 40 on the display panel 10, and an optical functional layer 50. The display panel 10, the input detection layer 40, and the optical functional layer 50 may be covered by a window 60. The display apparatus 1 may be included various types of electronic devices such as a mobile phone, a notebook computer, or a smart watch.

The display panel 10 may display an image. The display panel 10 includes pixels in the display area DA. The pixels may include a display element and a pixel circuit connected to the display element. The display element may include an organic light-emitting diode, a quantum dot organic light-emitting diode, or the like.

The input detection layer 40 obtains coordinate information according to an external input, for example, a touch event. The input detection layer 40 may include a sensing electrode (or, e.g., a touch electrode) or trace lines connected to the sensing electrode. The input detection layer 40 may be arranged on the display panel 10. The input detection layer 40 may detect an external input by using a mutual cap method and/or a self-cap method.

For example, the input detection layer 40 may be arranged directly on the display panel 10, or separately formed, and then, combined with the display panel 10 by using an adhesive layer such as an optical clear adhesive. For example, the input detection layer 40 may be formed after a process of forming the display panel 10 is performed. In this case, the input detection layer 40 may be understood as a part of the display panel 10, and the adhesive layer may not be arranged between the input detection layer 40 and the display panel 10. FIG. 2 shows that the input detection layer 40 is arranged between the display panel 10 and the optical functional layer 50. However, according to an exemplary embodiment of the present inventive concept, the input detection layer 40 may be arranged on the optical functional layer 50.

The optical functional layer 50 may include a reflection prevention layer. The reflection prevention layer may reduce reflectivity of light (e.g., external light) incident toward the display panel 10 from outside via the window 60. The reflection prevention layer may include a retarder and/or a polarizer. The retarder may be a film-type retarder or a liquid-crystal coating type retarder. The retarder may include a $\lambda/2$ retarder and/or a $\lambda/4$ retarder. The polarizer may be a film-type polarizer or a light-crystal coating type polarizer. The film-type polarizer may include a stretched synthetic resin film. The liquid-crystal coating type polarizer may include liquid crystals arranged in a particular arrangement. The retarder and the polarizer may further include a protective film. The retarder, the polarizer, or the protective film may be a base layer of the reflection prevention layer.

According to an exemplary embodiment of the present inventive concept, the reflection prevention layer may include a black matrix and color filters. The color filters may be arranged according to a color of light emitted from each of the pixels of the display panel 10. According to an exemplary embodiment of the present inventive concept, the reflection prevention layer may include a destructive interference structure. The destructive interference structure may include a first reflective layer and a second reflective layer arranged on different layers from each other. First reflected light and second reflected light reflected from the first reflective layer and the second reflective layer, respectively, may be destructively interfered, and thus, reflectivity of external light may be reduced.

The optical functional layer 50 may include a lens layer. The lens layer may increase light-emitting efficiency of light emitted from the display panel 10, or reduce a color deviation. The lens layer may include a layer having a concave or convex lens shape and/or include a plurality of layers having different refractive indices. The optical functional layer 50 may include both the reflection prevention layer and the lens layer, or either the reflection prevention layer or the lens layer.

In an exemplary embodiment of the present inventive concept, the optical functional layer 50 may be formed after a process of forming the display panel 10 and/or the input detection layer 40 is performed. In this case, an adhesive layer may not be arranged between the optical functional layer 50, the display panel 10, and/or the input detection layer 40.

The display panel 10, the input detection layer 40, and/or the optical functional layer 50 may include an opening. In relation to this, FIG. 2 shows that the display panel 10, the input detection layer 40, and the optical functional layer 50 each include first to third openings 10H, 40H, and 50H, and that the first to third openings 10H, 40H, and 50H overlap each other. For example, the first to third openings 10H, 40H, and 50H may be aligned with each other. The first to third openings 10H, 40H, and 50H are located to correspond to the component area OA. For example, first to third openings 10H, 40H, and 50H may be aligned with the component area OA. According to an exemplary embodiment of the present inventive concept, the display panel 10, the input detection layer 40, and/or the optical functional layer 50 may not include an opening. For example, one or two of the display panel 10, the input detection layer 40, and the optical functional layer 50 may not include an opening. In addition, the display panel 10, the input detection layer 40, and the optical functional layer 50 may not include an opening as shown in FIG. 3.

As described above, the component area OA may be an area in which the component 20 is located (e.g., the area may be a sensor area, a camera area, a speaker area, etc.). The component 20 is configured to add various functions to the display apparatus 1. As shown in FIG. 2, the component 20 may be located in the first to third openings 10H, 40H, and 50H. In addition, the component 20 may be arranged below the display panel 10, as shown in FIG. 3.

The component 20 may include an electronic element. For example, the component 20 may be an electronic element using light or sound. For example, the electronic element may include a sensor configured to output light and/or receive light, such as an infrared sensor, a camera configured to receive light and capture an image, a sensor configured to measure a distance or recognize a fingerprint, a small lamp configured to output light, a speaker configured to output sound, or the like. In the case of the electronic element using light, light in various wavelength bands, such as visible ray, infrared light, ultraviolet light, etc. may be used. In addition, the electronic element may be a temperature sensor, a barometric sensor, or a heart rate sensor. In an exemplary embodiment of the present inventive concept, the component area OA may be understood as a transmission area which light and/or sound may pass through. The light and/or the sound are output from the component 20 to outside or proceed from outside toward the component 20 (e.g., the electronic element).

According to an exemplary embodiment of the present inventive concept, when the display apparatus 1 is used as a smart watch or a vehicle dashboard, the component 20 may be a member such as a clock hand or a needle indicating predetermined information (e.g., a vehicle speed, etc.). When the display apparatus 1 includes the clock or the vehicle dashboard, the component 20 may pass through the window 60 and may be exposed to outside, and the window 60 may include an opening corresponding to the component area OA.

As described above, the component 20 may include a component (or components) related to a function of the display panel 10, a component increasing a sense of beauty of the display panel 10, such as an accessory, or the like. Although not shown in FIGS. 2 and 3, a layer including an optical transparent adhesive may be arranged between the window 60 and the optical functional layer 50.

FIGS. 4A to 4D are schematic cross-sectional views of the display panel 10 according to an exemplary embodiment of the present inventive concept.

Figure 4A:
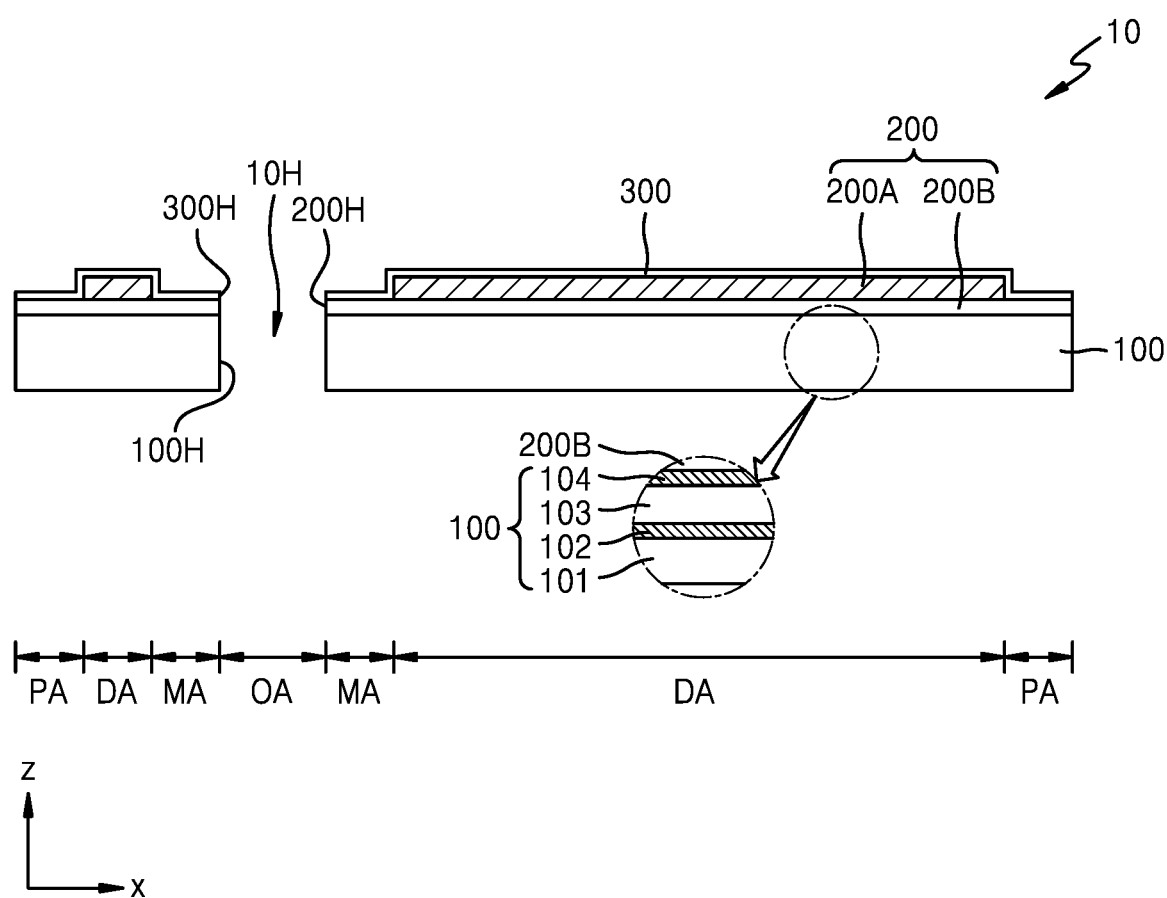
FIGS. 4A, 4B, 4C and 4D are schematic cross-sectional views of a display panel of FIG. 1.

Referring to FIG. 4A, the display panel 10 includes a display layer 200 on a substrate 100. For example, the substrate 100 may include a glass material or polymer resin. The substrate 100 may include multiple layers or may be a single layer. For example, as shown in a magnified view of FIG. 4A, the substrate 100 may include a first base layer 101, a first barrier layer 102, a second base layer 103, and a second barrier layer 104.

The first base layer 101 and the second base layer 103 may each include polymer resin. For example, the first base layer 101 and the second base layer 103 may include polyethersulphone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), or the like. For example the above-described polymer resin may be transparent.

The first barrier layer 102 and the second barrier layer 104 are barrier layers configured to prevent penetration of external foreign substances. The first barrier layer 102 and the second barrier layer 104 may include a single layer or multiple layers including an inorganic material such as silicon nitride (SiNx) or silicon oxide (SiOx).

The display layer 200 includes a plurality of pixels. The display layer 200 may include a display element layer 200A including display elements arranged in each of the pixels, and a pixel circuit layer 200B including a pixel circuit and insulating layers, both arranged in each of the pixels. The display element layer 200A may have a stacked structure in which a pixel electrode, an opposite electrode, and an intermediate layer arranged therebetween are stacked. Each of the display elements may be an organic light-emitting diode (OLED). Each pixel circuit may include a thin-film transistor and a storage capacitor.

The display elements of the display layer 200 may be covered by an encapsulation member such as a thin-film encapsulation layer 300. The thin-film encapsulation layer 300 may include at least one inorganic encapsulation layer and at least one organic encapsulation layer. When the display panel 10 includes the substrate 100 including polymer resin and the thin-film encapsulation layer 300 including the inorganic encapsulation layer and the organic encapsulation layer, flexibility of the display panel 10 may be increased.

The display panel 10 may include the first opening 10H passing through the display panel 10. The first opening 10H may be arranged in, the component area OA. In this case, the component area OA corresponds to the first opening 10H. FIG. 4A shows that the substrate 100 and the thin-film encapsulation layer 300 each include through-holes 100H and 300H corresponding to the first opening 10H of the display panel 10. The display layer 200 may also include a through-hole 200H corresponding to the component area OA and the first opening 10H.

Figure 4B:
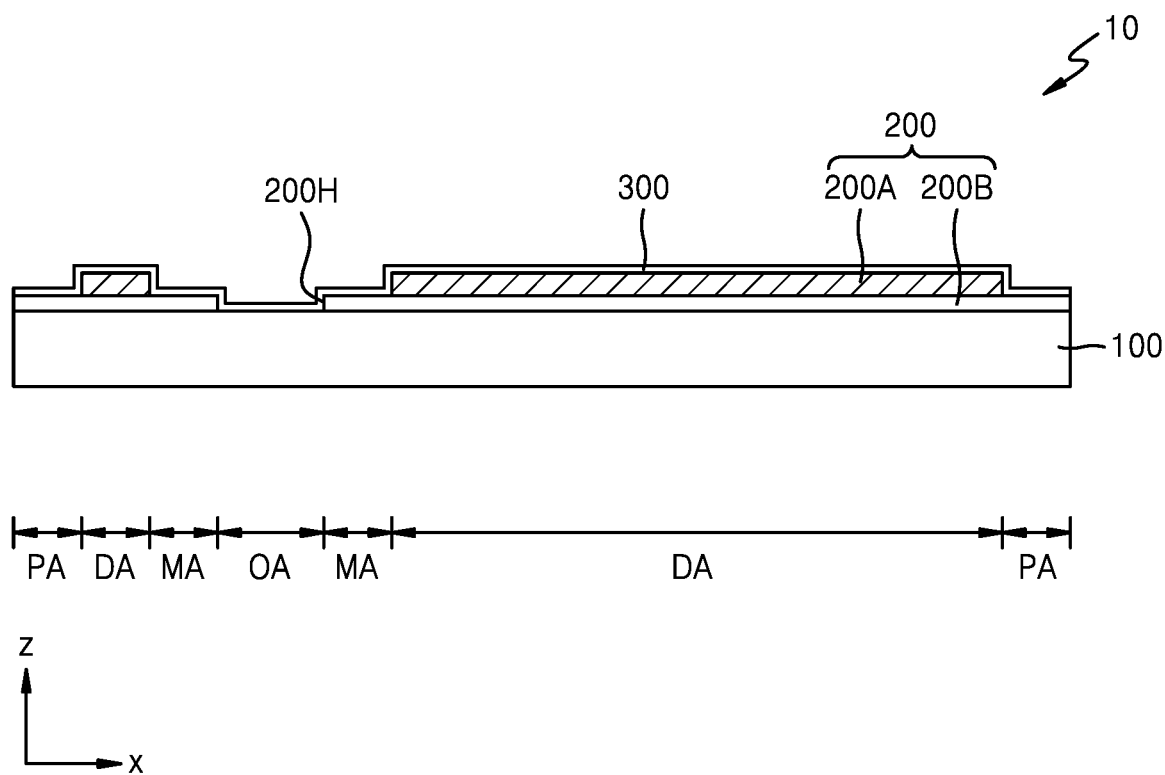

According to an exemplary embodiment of the present inventive concept, as shown in FIG. 4B, the substrate 100 may not include a through-hole corresponding to the component area OA. The display layer 200 may include the through-hole 200H corresponding to the component area OA. The thin-film encapsulation layer 300 may not include a through-hole corresponding to the component area OA. According to an exemplary embodiment of the present inventive concept, as shown in FIG. 4C, the display layer 200 may not include the through-hole 200H corresponding to the component area OA.

Figure 4C:
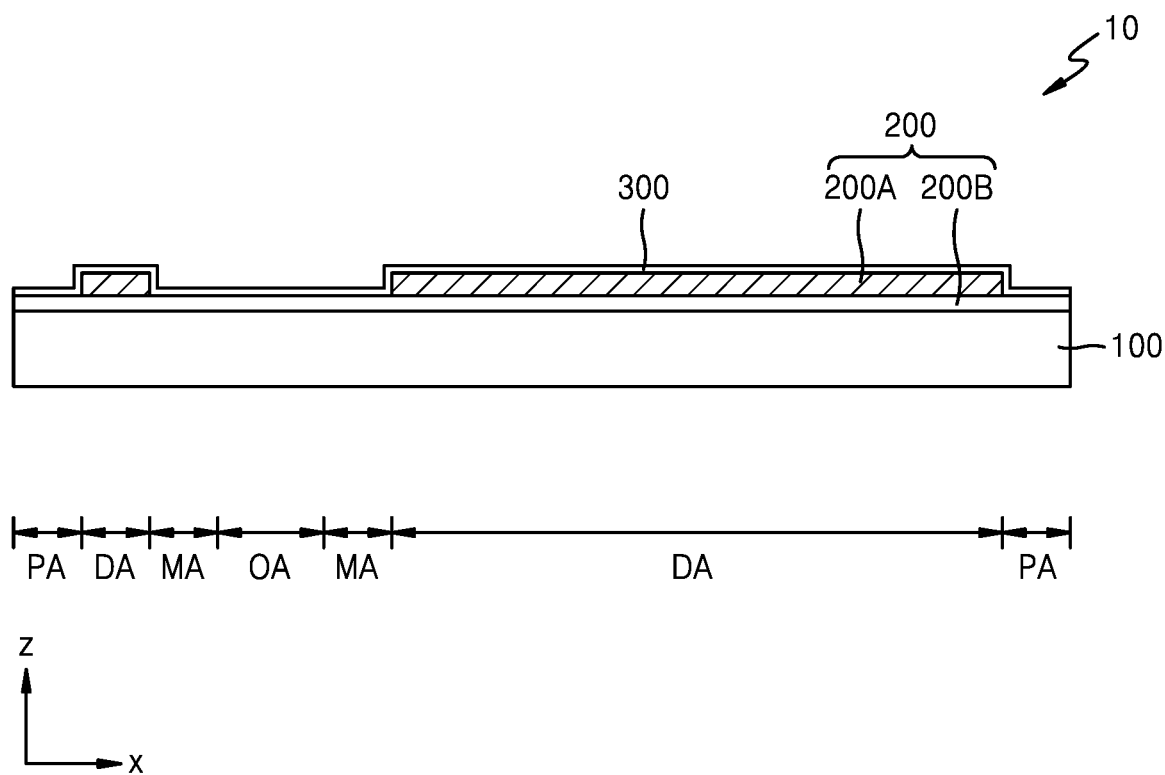
Figure 4D:
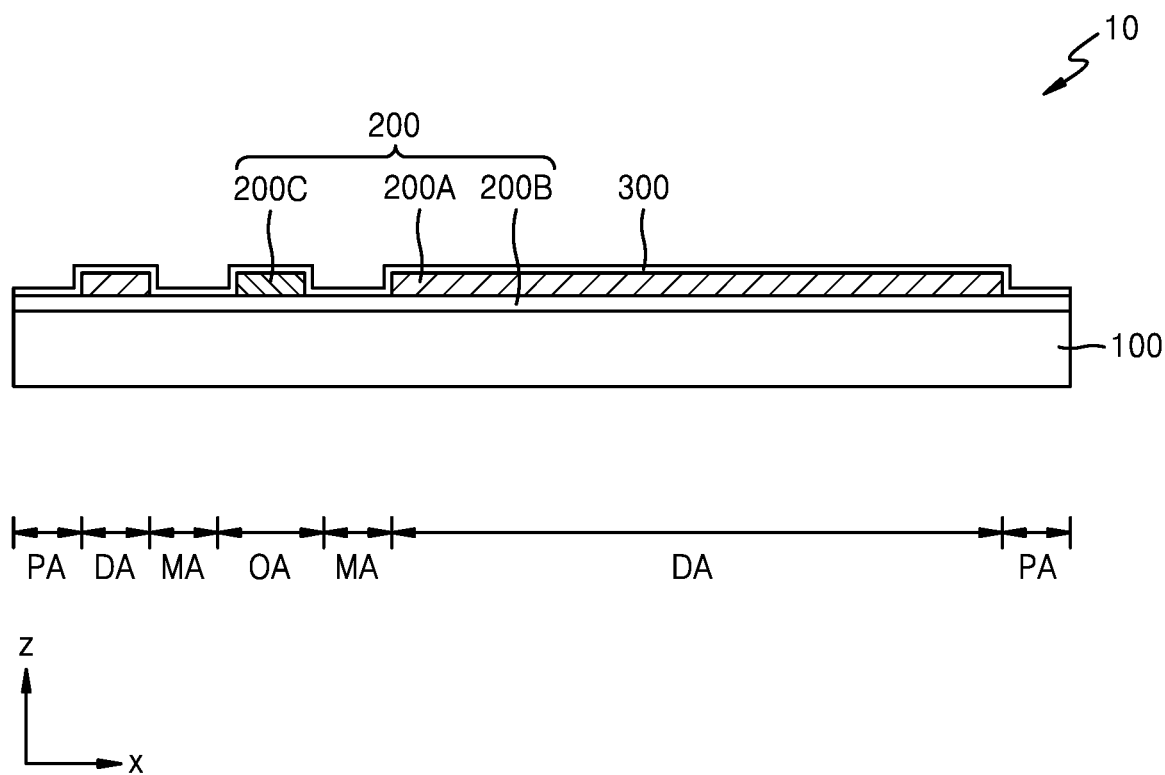

FIGS. 4A to 4C show that the display element layer 200A is not arranged in the component area OA. However, the present inventive concept is not limited thereto, According to an exemplary embodiment of the present inventive concept, as shown in FIG. 4D, an auxiliary display element layer 200C may be located in the component area OA. The auxiliary display element layer 200C may include a display element having a different structure and/or operation by using a different method from that of the display element of the display element layer 200A.

According to an exemplary embodiment of the present inventive concept, each of the pixels of the display element layer 200A includes an active-matrix organic light-emitting diode. The auxiliary display element layer 200C may include pixels including a passive-matrix organic light-emitting diode. When the auxiliary display element layer 200C includes a display element that is the passive-matrix organic light-emitting diode, components of a pixel circuit may not be present below the passive-matrix organic light-emitting diode. For example, a portion of the pixel circuit layer 200B below the auxiliary display element layer 200C may not include a thin-film transistor and a storage capacitor.

According to an exemplary embodiment of the present inventive concept, the auxiliary display element layer 200C may include a same type of display element as that, of the display element layer 200A (e.g., an active-matrix organic light-emitting diode). However, a structure of a pixel circuit below the auxiliary display element layer 200C may be different from that of a pixel circuit below the display element layer 200A. For example, the pixel circuit below the auxiliary display element layer 200C (e.g., a pixel circuit having a light-shielding layer between a substrate and a thin-film transistor, etc.) may include a structure different from that of the pixel circuit below the display element layer 200A. In addition, display elements of the auxiliary display element layer 200C may operate according to a control signal different from that of the display elements of the display element layer 200A. In the component area OA in which the auxiliary display element layer 200C is arranged, a component that does not need high transmittance (e.g., an infrared sensor, etc.) may be arranged In this case, the component area OA may be understood as a component area, as well as an auxiliary display area.

Figure 5:
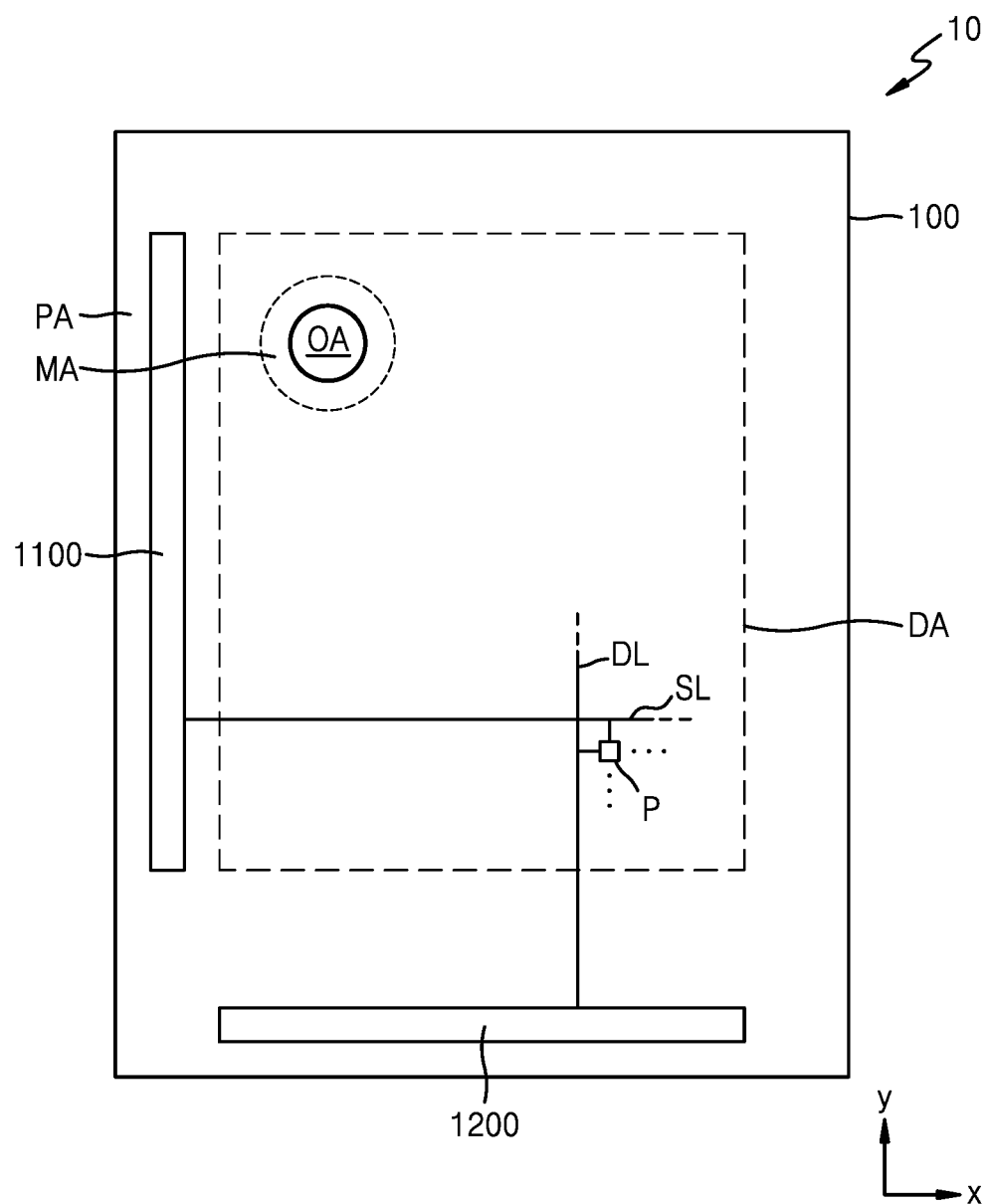
FIG. 5 is a plan view of the display panel of FIG. 1.
Figure 6:
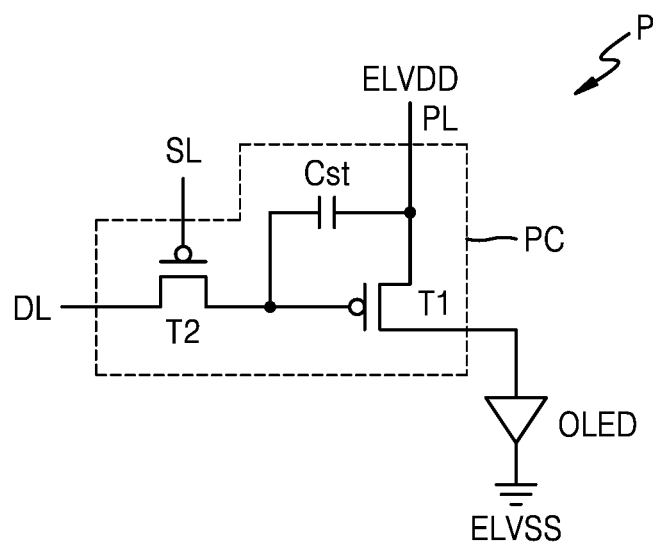
FIG. 6 is a circuit diagram of a pixel in the display panel of FIG. 1.

FIG. 5 is a schematic plan view of the display panel 10 according to an exemplary embodiment of the present inventive concept. FIG. 6 is a circuit diagram of a pixel in the display panel 10 according to an exemplary embodiment of the present inventive concept.

Referring to FIG. 5, the display panel 10 may include the component area OA that is the first area, the display area DA that is the second area, the middle area MA that is the third area, and the peripheral area PA that is the fourth area. It may be understood that FIG. 5 shows a shape of the substrate 100 in the display panel 10. For example, it may be understood that the substrate 100 includes the component area OA, the display area DA, the middle area MA, and the peripheral area PA. For example, the substrate 100 may have a quadrangular shape with an opening that corresponds to the component area OA.

The display panel 10 includes a plurality of pixels P in the display area DA. As shown in FIG. 6, each of the pixels P may include a pixel circuit PC, and an organic light-emitting diode OLED as a display element connected to the pixel circuit PC. The pixel circuit PC may include a first thin-film transistor T1, a second thin-film transistor T2, and a storage capacitor Cst. Each of the pixels P may emit, for example, red, green, blue, or white light via the organic light-emitting diode OLED.

The second thin-film transistor T2 is a switching thin-film transistor. The second thin-film transistor T2 is connected to a scan line SL and a data line DL. Based on a switching voltage input from the scan line SL, the second thin-film transistor T2 may transmit a data voltage to the first thin-film transistor T1 when the data voltage is input from the data line DL. The storage capacitor Cst is connected to the second thin-film transistor T2 and a driving voltage line PL. The storage capacitor Cst may store a voltage corresponding to a difference between a voltage transmitted from the second thin-film transistor T2 and a first power voltage ELVDD supplied to a supply voltage line PL.

The first thin-film transistor T1 is a driving thin-film transistor. The first thin-film transistor T1 is connected to the driving voltage line PL and the storage capacitor Cst. The first thin-film transistor T1 may control driving current flowing from the driving voltage line PL to the organic light-emitting diode OLED, in correspondence with a voltage value stored in the storage capacitor Cst. The organic light-emitting diode OLED may emit light having predetermined brightness according to the driving current. An opposite electrode (e.g., a cathode) of the organic light-emitting diode OLED may receive a second power voltage ELVSS.

It is described with reference, to FIG. 6 that two thin-film transistors and one storage capacitor are included. However, the present inventive concept is not limited thereto. The number of thin-film transistors and the number of storage capacitors may be variously changed according to a design of the pixel circuit PC. For example, the pixel circuit PC may further include four, five, or more thin-film transistors, instead of the two thin-film transistors described above.

Referring back to FIG. 5, the middle area MA may surround the component area OA in a plan view. The middle area MA is an area in which a display element configured to emit light, such as an organic light-emitting diode, is not arranged. Signal lines may pass through and/or around the middle area MA, and the signal lines provide a signal to the pixels P in a periphery of the component area OA. In the peripheral area PA, a scan driver 1100, a data driver 1200, a main power wire, etc. may be arranged. The scan driver 1100 provides a scan signal to each of the pixels P, the data driver 1200 provides a data signal to each of the pixels P, and the main power wire provides a first power voltage and a second power voltage to each of the pixels P. FIG. 5 shows that the data driver 1200 is arranged adjacent to a side of the substrate 100. However, according to an exemplary embodiment of the present inventive concept, the data driver 1200 may be arranged on a flexible printed circuit board (FPCB) electrically connected to a pad arranged at a side of the display panel 10.

Figure 7:
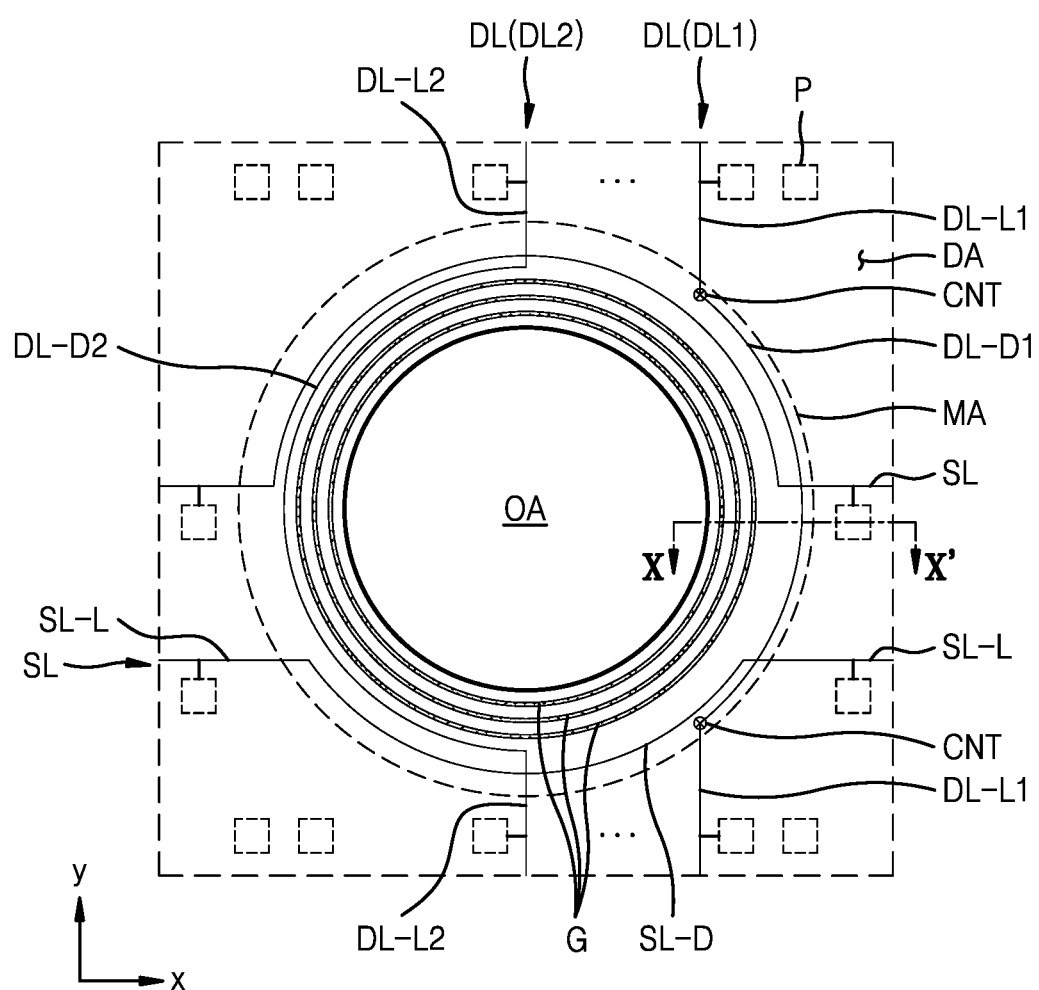
FIG. 7 is a magnified plan view of a component area of a display panel of FIG. 5.
Figure 8:
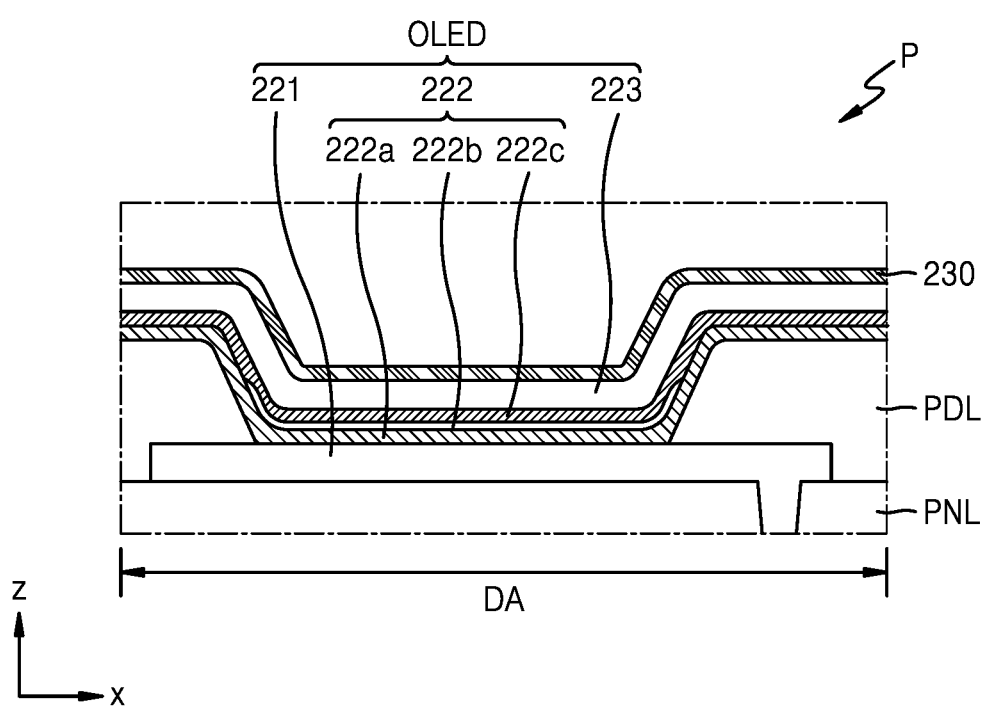
FIG. 8 is a schematic cross-sectional view of an organic light-emitting diode in a pixel in the display panel of FIG. 1.

FIG. 7 is a magnified plan view of a portion of the component area OA of the display panel 10 according to an exemplary embodiment of the present inventive concept. FIG. 8 is a schematic cross-sectional view of the organic light-emitting diode OLED included in a pixel P in the display panel 10 according to an exemplary embodiment of the present inventive concept. For the purpose of clarity, FIG. 8 does not show a thin-film encapsulation layer that is an encapsulation member.

Referring to FIG. 7, the pixels P are arranged in the display area DA with reference to the component area OA. The component area OA may be provided between the pixels P. For example, in a plan view, the pixels P may be each arranged below or above the component area OA, and the pixels P may be each arranged around the component area OA. For example, the pixels P may be arranged in a first direction (e.g., to the left of the component area OA) and a second direction (e.g., to the right of the component area OA).

As shown in FIG. 8, each of the pixels P may include the organic light-emitting diode OLED. The organic light-emitting diode OLED may include a pixel electrode 221, an opposite electrode 223 facing the pixel electrode 221, and an intermediate layer 222 between the pixel electrode 221 and the opposite electrode 223.

The pixel electrode 221 is located on a planarization layer PNL. The pixel electrode 221 may include conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). According to an exemplary embodiment of the present inventive concept, the pixel electrode 221 may include a reflective layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. According to an exemplary embodiment of the present inventive concept, the pixel electrode 221 may further include a layer including ITO, IZO, ZnO, or $In_2O_3$ above and/or below the reflective layer described above.

A pixel-defining layer PDL may be arranged on the pixel electrode 221. The pixel-defining layer PDL may include an opening exposing an upper surface of the pixel electrode 221, and may cover an edge of the pixel electrode 221. The pixel-defining layer PDL may include an organic insulating layer. In addition, the pixel-defining layer PDL may include an organic insulating layer or an inorganic insulating layer.

The intermediate layer 222 includes a light-emitting layer 222b. The intermediate layer 222 may include a first functional layer 222a below the light-emitting layer 222b and/or a second functional layer 222c on the light-emitting layer 222b. The light-emitting layer 222b may include a polymer organic material or a low-molecular weight organic material emitting light of a predetermined color.

The first functional layer 222a may include a single layer or multiple layers. For example, when the first functional layer 222a is formed of a polymer organic material, the first functional layer 222a may have a single-layered structure including a hole transport layer (HTL), and include poly(3, 4-ethylene dioxythiophene) (PEDOT) or polyaniline (PANI). When the first functional layer 222a is formed of a low-molecular weight organic material, the first functional layer 222a may include a hole injection layer (HIL) and a hole transport layer (HTL).

The second functional layer 222c may not be included. For example, when the first functional layer 222a and the light-emitting layer 222b include a polymer material, the second functional layer 222c might not be included. However, when the second functional layer 222c is included, the second functional layer 222c may include a single layer or multiple layers. The second functional layer 222c may include an electron transport layer (ETL) and/or an electron injection layer (EIL).

The light-emitting layer 222b in the intermediate layer 222 may be arranged in each of the pixels P. For example, the light-emitting layer 222b may be patterned to correspond to the pixel electrode 221. For example, the light-emitting layer 222b may overlap the pixel electrode 221. Unlike the light-emitting layer 222b, the first functional layer 222a and/or the second functional layer 222c in the intermediate layer 222 may be formed as a single body, and may each correspond to the plurality of pixels P.

The opposite electrode 223 may include a conductive material having a low work function. For example, the opposite electrode 223 may include a (semi)transparent layer including Ag, Mg, Al, Pt, Pd, Au, Ni, Nd, Ir, Cr, lithium (Li), calcium (Ca), an alloy thereof, or the like. In addition, the opposite electrode 223 may further include a layer including ITO, IZO, ZnO, or $In_2O_3$, on the (semi)transparent layer including the material described above. The opposite electrode 223 may be arranged in the middle area MA, as well as in the display area DA. For example, the first functional layer 222a, the second functional layer 222c, and the opposite electrode 223 may be formed by using a thermal deposition method.

The capping layer 230 may be arranged on the opposite electrode 223. For example, the capping layer 230 may include lithium (LiF), and be formed by using the thermal deposition method. In an exemplary embodiment of the present inventive concept, the capping layer 230 may not be included.

Among layers in the display panel 10, a layer including an organic material may provide a moisture penetration path via which moisture may proceed. Since the first functional layer 222a and/or the second functional layer 222c in a stacked structure of the organic light-emitting diode OLEO include an organic material, the first functional layer 222a and/or the second functional layer 222c may provide a travelling path for moisture. However, as grooves G in the middle area MA divide the first functional layer 222a and/or the second functional layer 222c, moisture penetration described above and damage to the organic light-emitting diode OLEO resulting therefrom may be prevented.

As shown in FIG. 7, one or more grooves G may be located in the middle area MA. In a plan view shown in FIG. 7, the grooves G may each have an annular shape surrounding the component area OA, and may be arranged to be spaced apart from each other.

The grooves G may be formed in multiple layers including a plurality of layers. The grooves G having a concave shape in a direction of a depth of the multiple layers may have an undercut structure. Hereinafter, structures of the multiple layers and the grooves G are described with reference to FIG. 9.

Figure 9:
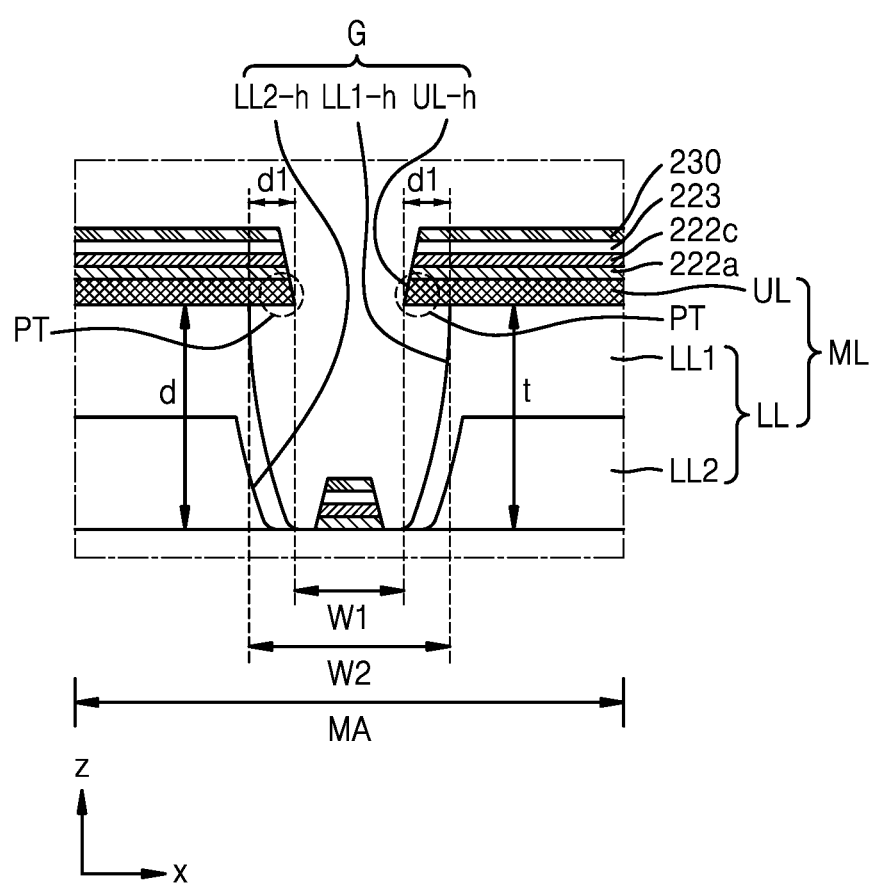
FIG. 9 is a cross-sectional view of a groove in the display panel of FIG. 1.

FIG. 9 is a cross-sectional view of a groove G in the display panel 10 according to an exemplary embodiment of the present inventive concept. For the purpose of clarity, FIG. 9 does not show a thin-film encapsulation layer that is an encapsulation member.

Referring to FIG. 9, multiple layers ML include a lower layer LL and an upper layer UL. The lower layer LL may include a first sub-lower layer LL1 and a second sub-lower layer LL2 therebelow. The upper layer UL may be a single layer. However, the present inventive concept is not limited thereto. For example, the upper layer UL may include multiple layers.

The lower layer LL and the upper layer UL may include different materials from each other. For example, the first sub-lower layer LL1 and the second sub-lower layer LL2 may include an organic material, for example, an organic insulating material, and the upper layer UL may include an inorganic material.

The organic insulating material of the lower layer LL may be, for example, a general-purpose polymer such as polymethyl methacrylate (PMMA) or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a blend thereof.

An inorganic material of the upper layer (UL) may include conductive oxide such as IZO, ITO; ZnO, $In_2O_3$, IGO, and/or AZO. In addition, the inorganic material may include metal such as molybdenum (Mo), Al, copper (Cu), and/or titanium (Ti). In addition, the inorganic material may include an insulating material such as SiNx, SiOx, and/or silicon oxynitride (SiOxNy).

The groove G may be arranged in a direction of a depth of the multiple layers ML. For example, the groove G may extend toward an upper surface of the substrate 100. The grooves G may include an upper-hole (UL-h) of the upper layer UL, a first lower-hole LL1-h of the first sub-lower layer LL1, and a second lower-hole LL2-h of the second sub-lower layer LL2.

A depth d of the groove G may be substantially the same as a thickness t of the lower layer LL. A bottom surface of the groove G may be arranged on a same surface as that of a bottom surface of the second sub-lower layer LL2. However, the present inventive concept is not limited thereto; for example, the bottom surface of the groove G may be disposed on a surface different from that of the bottom surface of the second sub-lower layer LL2.

The groove G has an undercut structure. A first width W1 of the upper-hole UL-H may be formed to be less than a width of the lower layer LL, for example, a second width W2 of the first lower-hole LL1-H of the first sub-lower layer LL1. Ends of the upper layer UL protruding toward the groove G (for example, toward a center of the groove G)

may form a pair of tips PT. For example, the pair of tips PT may be edges of the upper layer UL. For example, the tips PT may extend beyond an inner surface of the first sub-lower layer LL1 toward the center of the groove G. A protruding length d1 of each of the pair of tips PT may be less than the depth d of the groove G. The protruding length d1 of each of the pair of tips PT may be less than about 2 μm. For example, the protruding length d1 of each of the pair of the tips PT may be less than about 1 μm to 1.5 μm. The depth d of the groove G may be about 2 μm or greater, about 2.5 μm or greater about 3 μm or greater, or about 3.5 μm or greater.

An organic material layer (or organic material layers) in the stacked structure of the organic light-emitting diode OLEO (shown in FIG. 8), described above with reference to FIGS. 7 and 8, may be divided by the groove G. For example, the first functional layer 222a and the second functional layer 222c may be divided by the groove G, as shown in FIG. 9. Likewise, the opposite electrode 223 and the capping layer 230 may be divided by the groove G. As described above, the second functional layer 222c and/or the capping layer 230 may not be provided. In this case, the second functional layer 222c and/or the capping layer 230 that were not provided are not present in a periphery of the groove G.

Referring back to FIG. 7, the middle area MA is arranged between the component area OA and the display area DA, and a plurality of grooves G are arranged in the middle area MA. FIG. 7 shows three grooves G. However, one groove G may be present. In addition, four or more, six or more, nine or more, ten or more, or eleven or more grooves G may be present.

Lines may detour (or bypass) an edge of the component area OA in the middle area MA. Signal lines connected to the pixels P spaced apart from each other with reference to the component area OA may extend along the edge of the component area OA in the middle area MA.

In a plan view of FIG. 7, at least one data line DL passing through the display area DA may extend in a y-direction to provide a data signal to the pixels P arranged over and below the component area OA, respectively, and extend along the edge of the component area OA in the middle area MA. Similarly, at least one scan line SL, among scan lines LS passing through the display area DA, may extend in an x-direction to provide a scan signal to the pixels P arranged at left and right of the component area OA, respectively, and extend along the edge of the component area OA in the middle area MA.

A circuitous portion (or, e.g., a bypass portion or a portion extending around the component area OA) SL-D of the scan line SL may be arranged on a same layer as that of an extended portion SL-L traversing the display area DA and formed as a single body with the extended portion SL-L. A circuitous portion DL-D1 of at least one data line (hereinafter, referred to a first data line DL1) among the data lines DL may be arranged on a layer different from that of an extending portion DL-L1. The circuitous portion of the data line DL may be connected to the extending portion DL-L1 via a contact hole CNT. A circuitous portion DL-D2 of at least one data line DL2 (hereinafter, referred to a second data line) among the data lines DL may be arranged on a same layer as that of an extending portion DL-L2, and formed as a single body with the extending portion DL-L2.

Figure 10:
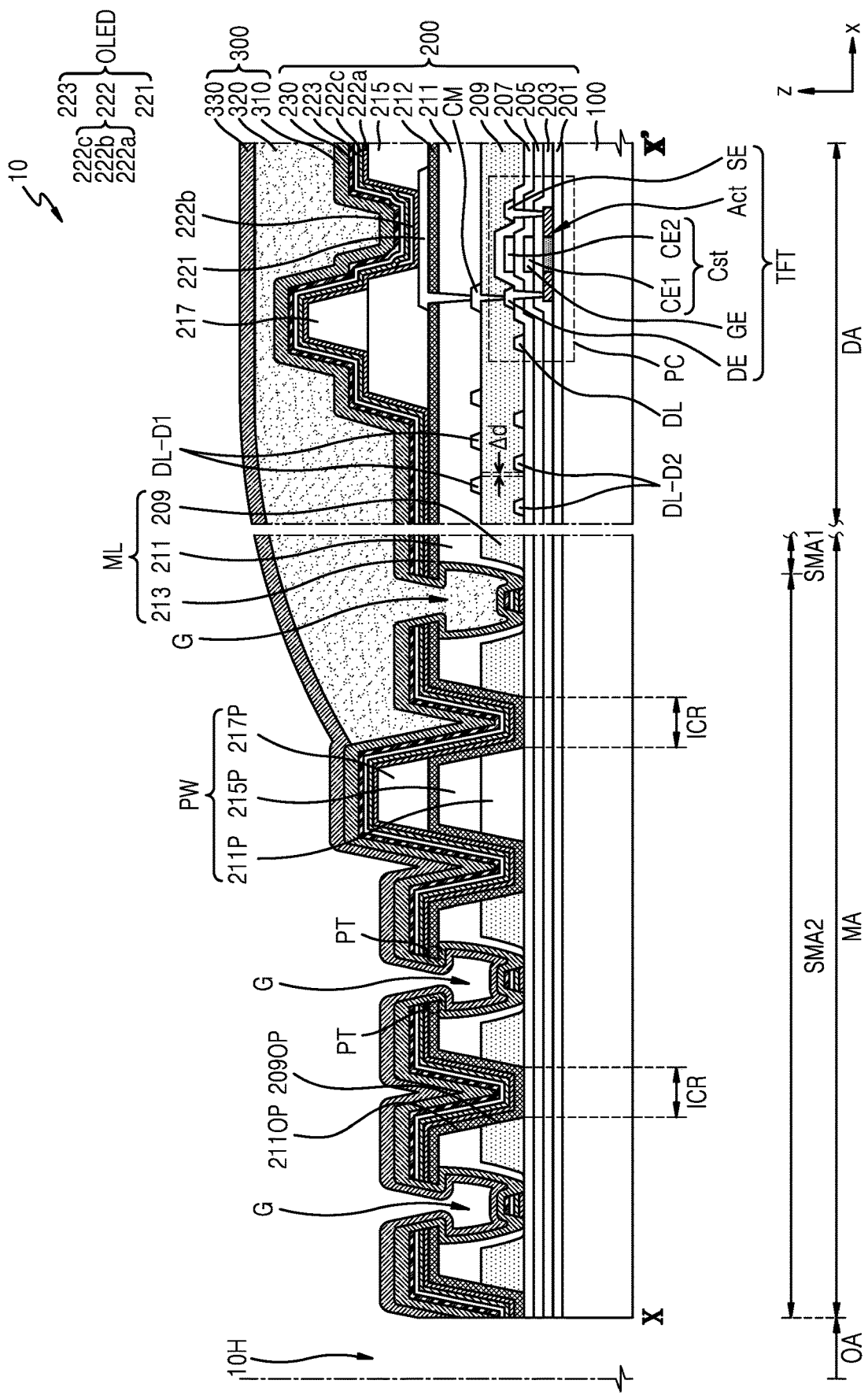
FIG. 10 is a cross-sectional view of the component area taken along a line X-X' of FIG. 7.
Figure 11:
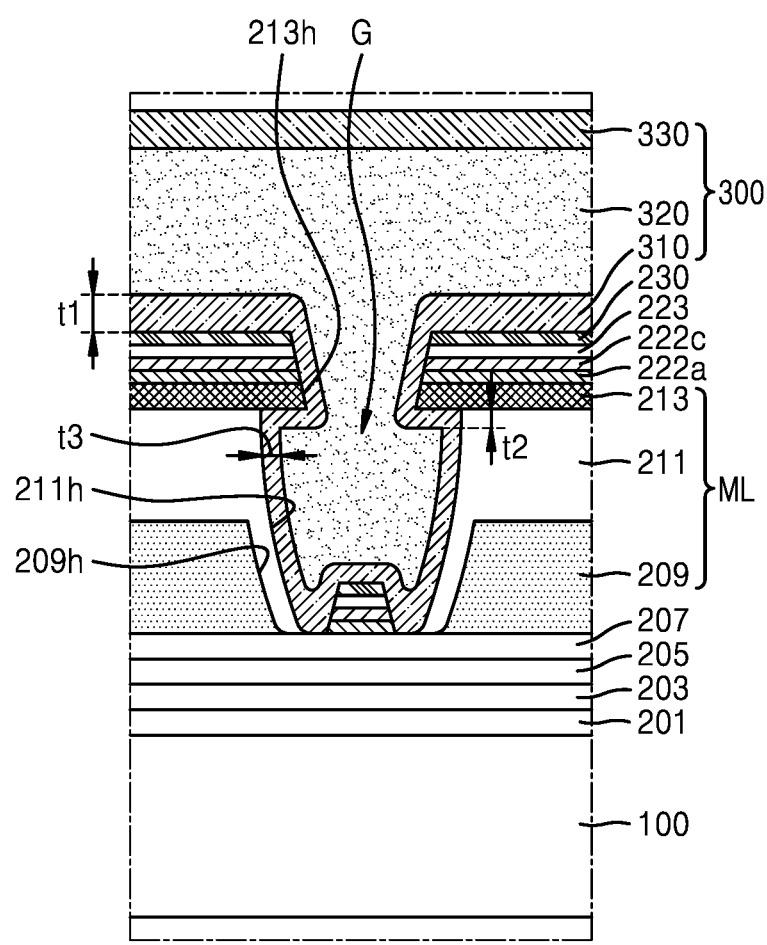
FIG. 11 is a magnified cross-sectional view of a groove adjacent to a display area of FIG. 10.

FIG. 10 is a cross-sectional view of the component area OA taken along a line X-X' of FIG. 7. FIG. 11 is a magnified cross-sectional view of a groove area adjacent to the display area DA of FIG. 10.

Referring to FIG. 10, the middle area MA is arranged between the component area OA and the display area DA. In the display area DA, the pixel circuits PC and the organic light-emitting diodes OLED, both corresponding to each of the pixels P (shown in FIG. 10), are located.

First, referring to the display area DA of FIG. 10, the substrate 100 may include a glass material or polymer resin. According to an exemplary embodiment of the present inventive concept, the substrate 100 may include a plurality of sub-layers as shown in a magnified view of FIG. 4A.

On the substrate 100, a buffer layer 201 may be arranged, and the buffer layer 201 may prevent penetration of impurities into a semiconductor layer Act of a thin-film transistor TFT. The buffer layer 201 may include an inorganic insulating layer such as SiNx, SiOxNy, or SiOx. The buffer layer 201 may include a single layer or multiple layers including the inorganic insulating material described above.

The pixel circuit PC may be arranged on the buffer layer 201. The pixel circuit PC includes the thin-film transistor TFT and the storage capacitor Cst. The thin-film transistor TFT may include the semiconductor layer Act, a gate electrode GE, a source electrode SE, and a drain electrode DE. The data line DL of the pixel circuit PC may be electrically connected to a switching thin-film transistor included in the pixel circuit PC. In the present embodiment, as shown in FIG. 10 as an example, the gate electrode GE is a top-gate type electrode arranged over the semiconductor layer Act to have a gate insulating layer 203 therebetween. However, according to an exemplary embodiment of the present inventive concept, the thin-film transistor TFT may be a bottom-gate type transistor.

The semiconductor layer Act may include polysilicon. In addition, the semiconductor layer Act may include amorphous silicon, an oxide semiconductor, an organic semiconductor, or the like. The gate electrode GE may include a low-resistance metal material. The gate electrode GE may include a conductive material including Mo, Al, Cu, Ti, or the like. The gate electrode GE may include a single layer or multiple layers including the above-described material.

The gate insulating layer 203 is arranged between the semiconductor layer Act and the gate electrode GE, and may include an inorganic insulating material such as SiOx, SiNx, SiOxNy, aluminum oxide, titanium oxide, tantalum oxide, hafnium oxide, etc. The gate insulating layer 203 may include a single layer or multiple layers including the material described above.

The source electrode SE and the drain electrode DE may be located on a same layer as that of the data line DL and include a same material as that of the data line DL. The source electrode SE, the drain electrode DE, and the data line DL may include a material having conductivity. The source electrode SE and the drain electrode DE may include a conductive material such as Mo, Al, Cu, Ti, or the like. The source electrode SE and the drain electrode DE may include a single layer or multiple layers including the above-described material. According to an exemplary embodiment of the present inventive concept, the source electrode SE, the drain electrode DE, and the data line DL may include multiple layers including Ti/Al/Ti.

The storage capacitor Cst may include a lower electrode CE1 and an upper electrode CE2 overlapping each other to have a first interlayer insulating layer 205 therebetween. The storage capacitor Cst may overlap the thin-film transistor TFT. In relation to this, FIG. 10 shows that the gate electrode GE of the thin-film transistor TFT is the lower electrode CE1 of the storage capacitor Cst. According to an exemplary embodiment of the present inventive concept, the storage capacitor Cst may not overlap the thin-film transistor TFT. The storage capacitor Cst may be covered by a second interlayer insulating layer 207. The upper electrode CE2 of the storage capacitor Cst may include a conductive material such as Mo, Al, Cu, Ti, or the like. The upper electrode CE2 may include a single layer or multiple layers including the above-described material.

A first interlayer insulating layer 205 and the second interlayer insulating layer 207 may include an inorganic insulating material such as SiOx, SiNx, SiOxNy, aluminum oxide, titanium oxide, tantalum oxide, hafnium oxide, etc. The first interlayer insulating layer 205 and the second interlayer insulating layer 207 may include a single layer or multiple layers including the material described above.

The pixel circuit PC includes the first thin-film transistor TFT and the storage capacitor Cst, and may be covered by a first organic insulating layer 209. The first organic insulating layer 209 may include a substantially flat upper surface.

The pixel circuit PC may be electrically connected to the pixel electrode 221. For example, as shown in FIG. 10, a contact metal layer CM may be arranged between the thin-film transistor TFT and the pixel electrode 221. The contact metal layer CM may be connected to the thin-film transistor TFT via a contact hole in the first organic insulating layer 209. The pixel electrode 221 may be connected to the contact metal layer CM via a contact hole arranged in the second organic insulating layer 211 on the contact metal layer CM. The contact metal layer CM may include a conductive material such as Mo, Al, Cu, Ti, or the like. The contact metal layer CM may include a single layer or multiple layers including the above-described material. According to an exemplary embodiment of the present inventive concept, the contact metal layer CM may include three layers including Ti/Al/Ti.

The first organic insulating layer 209 and the second organic insulating layer 211 may include an organic insulating material such as a general-purpose polymer such as PMMA or PS, a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a blend thereof. According to an exemplary embodiment of the present inventive concept, the first organic insulating layer 209 and the second organic insulating layer 211 may include PI.

The pixel electrode 221 may be arranged on the second organic insulating layer 211. The second organic insulating layer 211 may be understood as a planarization layer described above with reference to FIG. 8. An edge of the pixel electrode 221 may be covered by a pixel-defining layer 215. The pixel-defining layer 215 may include an opening overlapping a center portion of the pixel electrode 221. A spacer 217 may be arranged on the pixel-defining layer 215. The spacer 217 may include a material different from that of the pixel-defining layer 215 or a same material as that of the pixel-defining layer 215. According to an exemplary embodiment of the present inventive concept, the pixel-defining layer 215 and the spacer 217 may include a same material, and be formed together in a mask process using a halftone mask. According to an exemplary embodiment of the present inventive concept, the pixel-defining layer 215 and the spacer 217 may include PI.

With reference to FIGS. 8 and 10, The intermediate layer 222 includes the light-emitting layer 222b. The intermediate layer 222 may include the first functional layer 222a below the light-emitting layer 222b and/or the second functional layer 222c on the light-emitting layer 222b. The light-emitting layer 222b may include a polymer organic material or a low-molecular weight organic material emitting light of a predetermined color. The opposite electrode 223 may be arranged on the intermediate layer 222. The capping layer 230 may be arranged on the opposite electrode 223. In an exemplary embodiment of the present inventive concept, the capping layer 230 may not be provided.

Materials, structures, and characteristics of the pixel electrode 221, the intermediate layer 222, and the opposite electrode 223 are described above with reference to FIG. 8.

The organic light-emitting diode OLED is covered by the thin-film encapsulation layer 300. The thin-film encapsulation layer 300 may include at least one organic encapsulation layer and at least one inorganic encapsulation layer. FIG. 11 shows that the thin-film encapsulation layer 300 includes first and second inorganic encapsulation layers 310 and 330, and an organic encapsulation layer 320 arranged therebetween. In an exemplary embodiment of the present inventive concept, the number of organic encapsulation layers, the number of inorganic encapsulation layers, and an order in which the organic encapsulation layers and the inorganic encapsulation layers are stacked may be changed.

The first inorganic encapsulation layer 310 and the second inorganic encapsulation layer 330 may include at least one inorganic material such as aluminum oxide, titanium oxide, tantalum oxide, hafnium oxide, zinc oxide, SiOx, SiNx, and/or SiOxNy. The first inorganic encapsulation layer 310 and the second inorganic encapsulation layer 330 may include a single layer or multiple layers including the material described above. The organic encapsulation layer 320 may include a polymer-based material. The polymer-based material may include an acrylic-based resin, an epoxy-based resin, PI, polyethylene, or the like. According to an exemplary embodiment of the present inventive concept, the organic encapsulation layer 320 may include acrylate.

A thickness of the first inorganic encapsulation layer 310 may be different from that of the second inorganic encapsulation layer 330. A thickness of the first inorganic encapsulation layer 310 may be greater than that of the second inorganic encapsulation layer 330. Alternatively, a thickness of the second inorganic encapsulation layer 330 may be greater than that of the first inorganic encapsulation layer 310, or a thickness of the first inorganic encapsulation layer 310 may be same as that of the second inorganic encapsulation layer 330.

Referring to the middle area MA of FIG. 10, the middle area MA may include a first sub-middle area SMA1 far from the component area OA, and a second sub-middle area SMA2 nearer to the component area OA than the first sub-middle area SMA1. For example, the second sub-middle area. SMA2 is provided between the component area OA and the first sub-middle area SMA1.

Lines, for example, signal lines may be located in the first sub-middle area SMA1. Circuitous portions (e.g., the circuitous portion DL-D1 and the circuitous portion DL-D2) of the first and second data lines DL1 and DL2, described above with reference to FIG. 7, may be located in the first sub-middle area SMA1 of FIG. 11. The first sub-middle area SMA1 may be understood as a line area or a circuitous area along which the data lines DL described above extend. The data lines DL in the middle area MA described with reference to FIG. 7 may include the first data lines DL1 and the and second data lines DL2 arranged alternately on and below the first organic insulating layer 209 to have the first organic insulating layer 209 therebetween. In relation to this, FIG. 10 shows that the circuitous portion DL-D1 of the first data line DL1 and the circuitous portion DL-D2 of the second data line DL2 are arranged to be separated from each other by the first organic insulating layer 209, and on and below the first organic insulating layer 209, respectively. In this case, a gap Δd (or a pitch) between the first data line DL1 and the second data line DL2 neighboring each other, for example, between the circuitous portion DL-D1 of the first data line DL1 and the circuitous portion DL-D2 of the second data line DL2 may be reduced.

The grooves G are arranged in the second sub-middle area SMA2. The grooves G are arranged on the multiple layers ML. According to an exemplary embodiment of the present inventive concept, as shown in FIG. 10, the multiple layers ML may include the first organic insulating layer 209, the second organic insulating layer 211, and an inorganic layer 213. The first organic insulating layer 209 and the second organic insulating layer 211 may correspond to the second sub-lower layer LL2 and the first sub-lower layer LL1 of the multiple layers ML described above with reference to FIG. 9. The inorganic layer 213 may correspond to the upper layer UL.

The inorganic layer 213 may include a material different from that of the pixel electrode 221. The inorganic layer 213 may include conductive oxide such as indium zinc oxide (IZO), indium tin oxide (ITO), zinc oxide (ZnO), $In_2O_3$, indium gallium oxide (IGO), and/or aluminum zinc oxide (AZO), metal such as Mo, Cu, and/or Ti, or an insulating material such as SiNx, SiOx, and/or SiOxNy. The inorganic layer 213 is arranged in the display area DA. The inorganic layer 213 may be formed by using a same process as that of the passivation layer 212 including an inorganic insulating material.

Referring to FIG. 11, a groove G may include a hole 213h of the inorganic layer 213, a hole 211h of the second organic insulating layer 211, and a hole 209h of the first organic insulating layer 209. In this case, a bottom surface of the groove G may be arranged on a same bottom surface as that of the first organic insulating layer 209. In addition, since the second organic insulating layer 211 covers the first organic insulating layer 209 to an end thereof, among the first and second organic insulating layer 209 and 211, an end of the second organic insulating layer 211 is exposed toward the groove G. The end of the second organic insulating layer 211 is also covered by the thin-film encapsulation layer 300.

The inorganic layer 213 includes the pair of tips PT extending toward the groove G. The protruding length d1 of the pair of tips PT may be less than about 2 μm, as described above. The depth d of the groove G may be about 2 μm or greater, about 2.5 μm or greater, about 3 μm or greater, or about 3.5 μm or greater. A process of forming the groove G will be described later.

As shown in FIG. 10, a partition PW may be located in middle area MA. The partition wall PW may be arranged between grooves G neighboring each other (e.g., a pair of grooves nearest each other). The partition wall PW may be formed by sequentially stacking a portion 211P of a layer constituting the second organic insulating layer 211, a portion 215P of a layer constituting the pixel-defining layer 215, and a portion 217P of a layer constituting the spacer 217. A height from an upper surface of the substrate 100 to an upper surface of the partition wall PW may be less than that from the upper surface of the substrate 100 to an upper surface of the spacer 217.

The middle area MA may include an inorganic contact region ICR. The inorganic contact region ICR may be arranged between grooves G neighboring each other. The inorganic contact region ICR is an area in which layers including an inorganic material are directly in contact with each other. FIG. 10 shows that the inorganic layer 213 is directly in contact with the second interlayer insulating layer 207. The inorganic layer 213 may be in contact with the second interlayer insulating layer 207 via openings 209OP and 211OP arranged in the first organic insulating layer 209 and the second organic insulating layer 211, respectively.

As described above, the first functional layer 222a, the second functional layer 222c, the opposite electrode 223, and the capping layer 230 may be divided by the groove G.

In an exemplary embodiment of the present inventive concept, the capping layer 230 may extend into the groove to cover inner side surfaces of the groove G. and may not be divided. For example, the capping layer 230 may be a single body.

The first inorganic encapsulation layer 310, the organic encapsulation layer 320, and the second inorganic encapsulation layer 330 may be sequentially formed. For example, the first inorganic encapsulation layer 310 may be formed by using a chemical vapor deposition method, etc. Unlike the first functional layer 222a, the second functional layer 222c, the opposite electrode 223, and the capping layer 230, the first inorganic encapsulation layer 310 has excellent step coverage. Accordingly, as shown in FIG. 11, the first inorganic encapsulation layer 310 may sequentially cover an inner wall of the groove G. For example, the first inorganic encapsulation layer 310 may be sequentially extended to cover a side surface and a bottom surface of the inorganic layer 213 and cover a side surface of the second organic insulating layer 211 and a bottom surface of the groove G.

As shown in FIG. 11, a first thickness t1 of a first portion of the first inorganic encapsulation layer 310 may be greater than a second thickness t2 of a second portion of the first inorganic encapsulation layer 310, wherein the first portion of the first inorganic encapsulation layer 310 is located over an upper surface of the inorganic layer 213, and the second portion of the first inorganic encapsulation layer 310 is located below a lower surface of the inorganic layer 213. In addition, the first thickness t1 of the first portion of the first inorganic encapsulation layer 310 may be greater than a third thickness t3 of a third portion of the first inorganic encapsulation layer 310 located on a side surface of the second organic insulating layer 211.

The first inorganic encapsulation layer 310 may include a single layer or a plurality of sub-layers. For example, the first inorganic encapsulation layer 310 may include two layers including SiOxNy and having different layer quality. In this case, the capping layer 230 may not be provided. In addition, the first inorganic encapsulation layer 310 may include SiOxNy and SiOx, SiOxNy and SiNx, or SiNx and SiOxNy As shown in FIG. 10, the organic encapsulation layer 320 may cover portions of the display area DA and the middle area MA. An end of the organic encapsulation layer 320, adjacent to the component OA, may be arranged to be adjacent to a side surface of the partition wall PW.

The second inorganic encapsulation layer 330 is located on the organic encapsulation layer 320, and may be directly in contact with the first inorganic encapsulation layer 310 in the middle area MA. For example, in an area between the component area OA and the partition wall PW, the first inorganic encapsulation layer 310 may be in contact with the second inorganic encapsulation layer 330.

Since the second inorganic encapsulation layer 330 has excellent step coverage similarly to that of the first inorganic encapsulation layer 310, the second inorganic encapsulation layer 330 may sequentially cover inner side surfaces of grooves G located between the component area OA and the partition wall PW. Similar to the first inorganic encapsulation layer 310, a thickness of a fourth portion of the second inorganic encapsulation layer 330 may be greater than that of a fifth portion of the second inorganic encapsulation layer 330. The fourth portion of the first inorganic encapsulation layer 310 is located over an upper surface of the inorganic layer 213, and the fifth portion of the second inorganic encapsulation layer 330 is located on a lower surface of the inorganic layer 213.

A structure shown in FIG. 10 may be understood as a structure surrounding the component area OA in a plan view. For example, when the grooves G of FIG. 10 are viewed from a direction perpendicular to an upper surface of the substrate 100 as shown in FIG. 7, the grooves G may have an annular shape surrounding the component area OA. Similarly, when the partition wall PW is viewed from a direction perpendicular to the upper surface of the substrate 100, the partition wall PW may have an annular shape surrounding the component area OA.

Now, referring to FIGS. 12A to 12I, a process of forming the groove G is described.

Figure 12A:
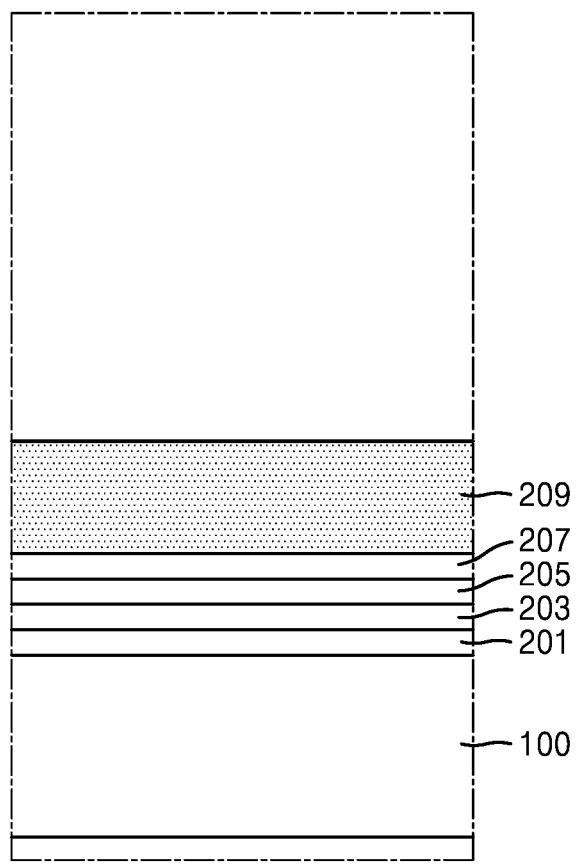
FIGS. 12A, 12B, 12C, 12D, 12E, 12F, 12G, 12H and 12I are cross-sectional views sequentially illustrating a process of manufacturing the groove of FIG. 11.

As shown in FIG. 12A, on the substrate 100, the buffer layer 201, the gate insulating layer 203, and the first and second interlayer insulating layers 205 and 207 are formed. Then, the first organic insulating layer 209 is formed on the first and second interlayer insulating layers 205 and 207. The first organic insulating layer 209 is a same layer as the first organic insulating layer 209 covering the thin-film transistor TFT and the capacitor Cst in the display area DA.

Figure 12B:
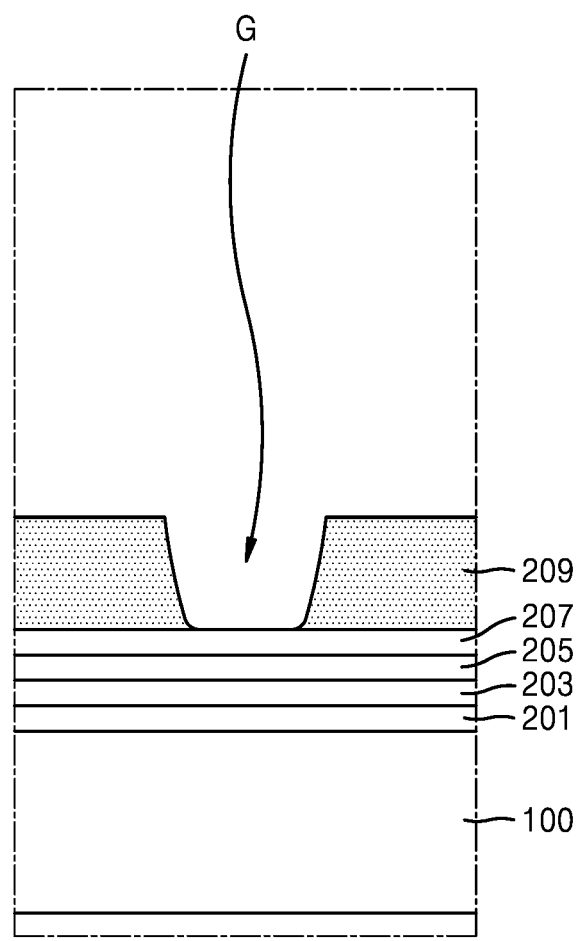

Next, as shown in FIG. 12B, a pattern of the groove G is formed on the first organic insulating layer 209 by using a photolithography process.

Figure 12C:
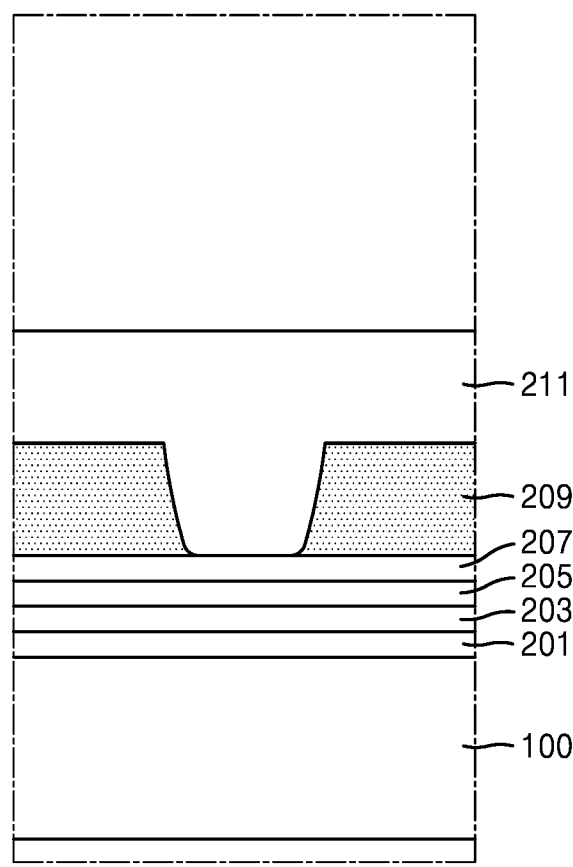

Then, as shown in FIG. 12C, the second organic insulating layer 211 is formed on the first organic insulating layer 209. The second organic insulating layer 211 is a same layer as the second organic insulating layer 211 located on the first organic insulating layer 209 in the display area DA.

Figure 12D:
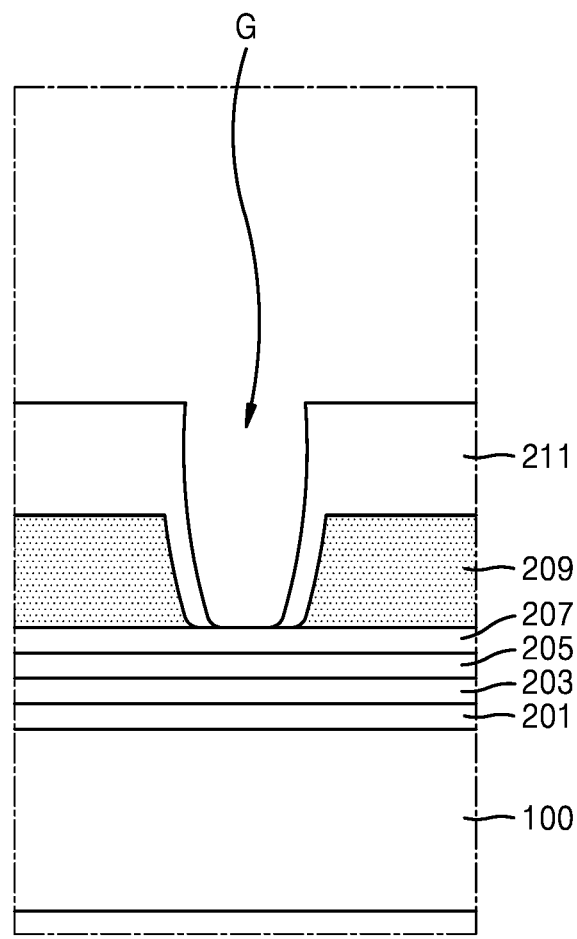

By patterning the second organic insulating layer 211, the pattern of the groove G is formed as shown in FIG. 12D. An end adjacent to the groove G in the first organic insulating layer 209 is covered by the second organic insulating layer 211.

Figure 12E:
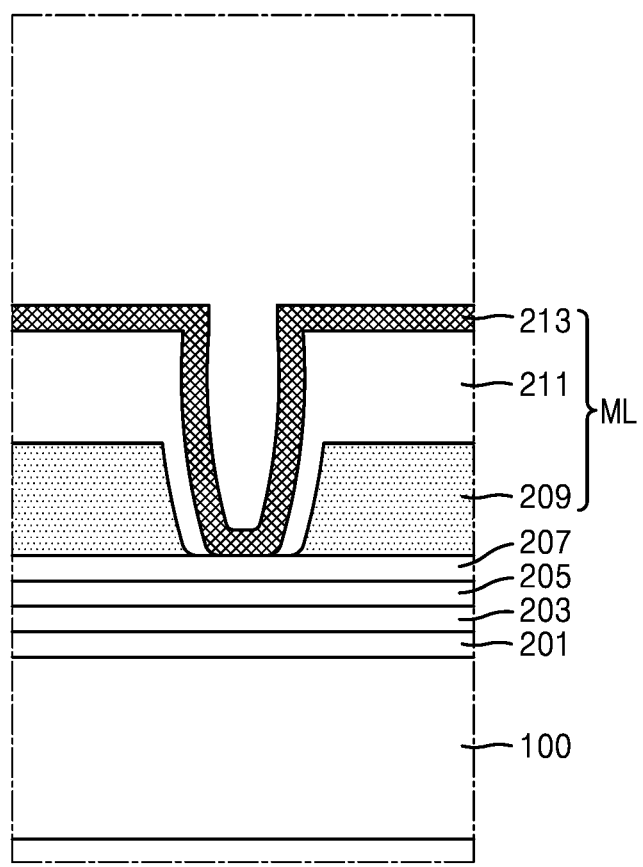
Figure 12F:
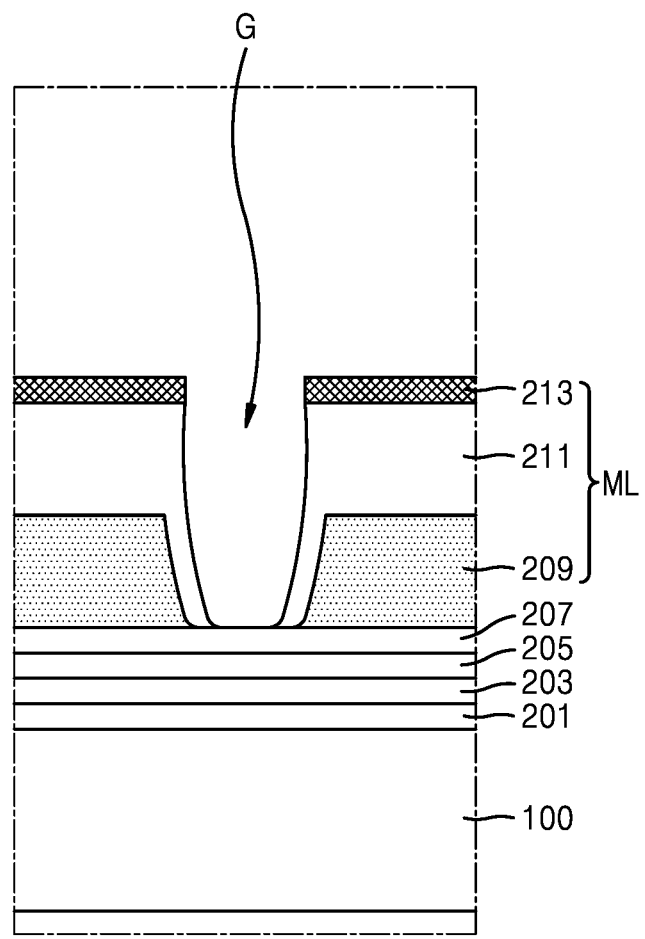

Then, as shown in FIG. 12E, the inorganic layer 213 is deposited on the second organic insulating layer 211 in the groove G. The inorganic layer 213 is a same layer as the passivation layer 212 in the display area DA. By patterning the inorganic layer 213, the groove G is formed as shown in FIG. 12F.

Figure 12G:
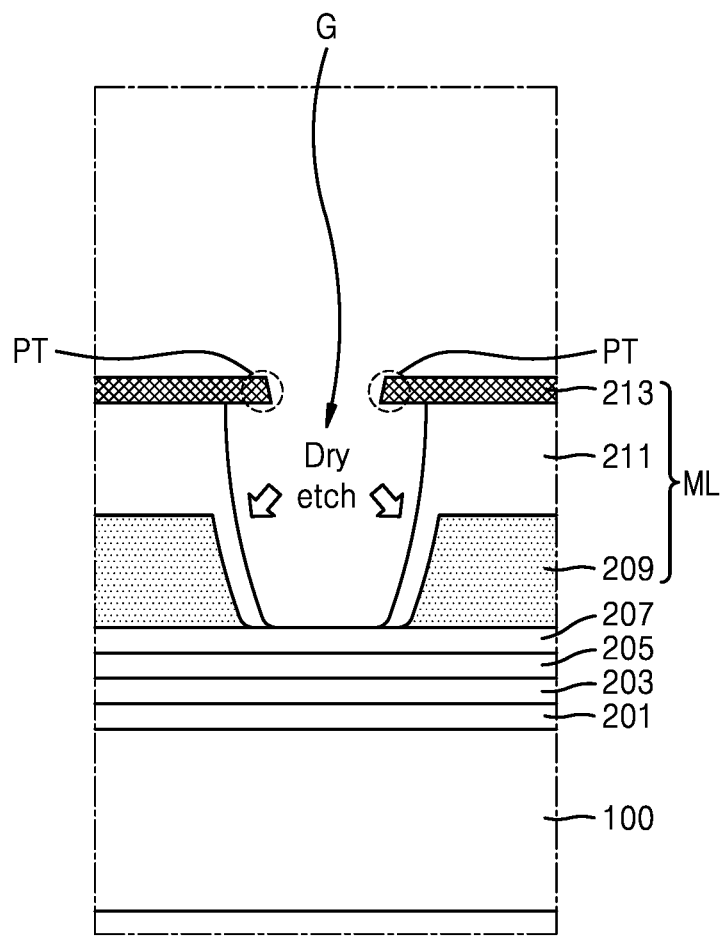

Next, dry etching using oxygen plasma is performed in a vacuum chamber. Then, as shown in FIG. 12G, not the inorganic layer 213, but the second organic insulating layer 211 that is an organic layer reacts with the oxygen plasma. Then, a surface of the second organic layer 211 in the groove G is partially removed, and thus, the pair of tips PT are formed. For example, the opening of the second organic layer 211 that corresponds to the groove G may be widened. For example, as an inner wall of the second organic insulating layer 211 forming the groove G is partially removed by performing dry etching, a form in which the inorganic layer 213 protrudes toward a center of the groove G is obtained.

Figure 12H:
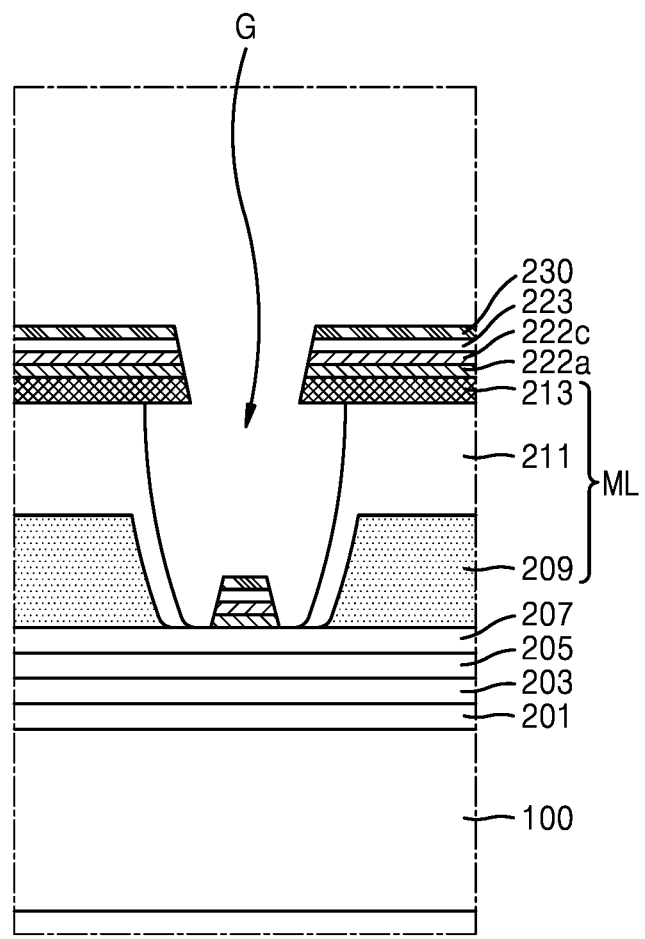

Then, as shown in FIG. 12H, the first and second functional layers 222a and 222c, the opposite electrode 223, and the capping layer 230 are sequentially formed, and each of the first and second functional layers 222a and 222c, the opposite electrode 223, and the capping layer 230 has a discontinuous structure due to the groove G. Accordingly, a path via which moisture may penetrate from outside into the display area DA along the first and second functional layers 222a and 222c that are organic layers may be disconnected in advance.

Figure 12I:
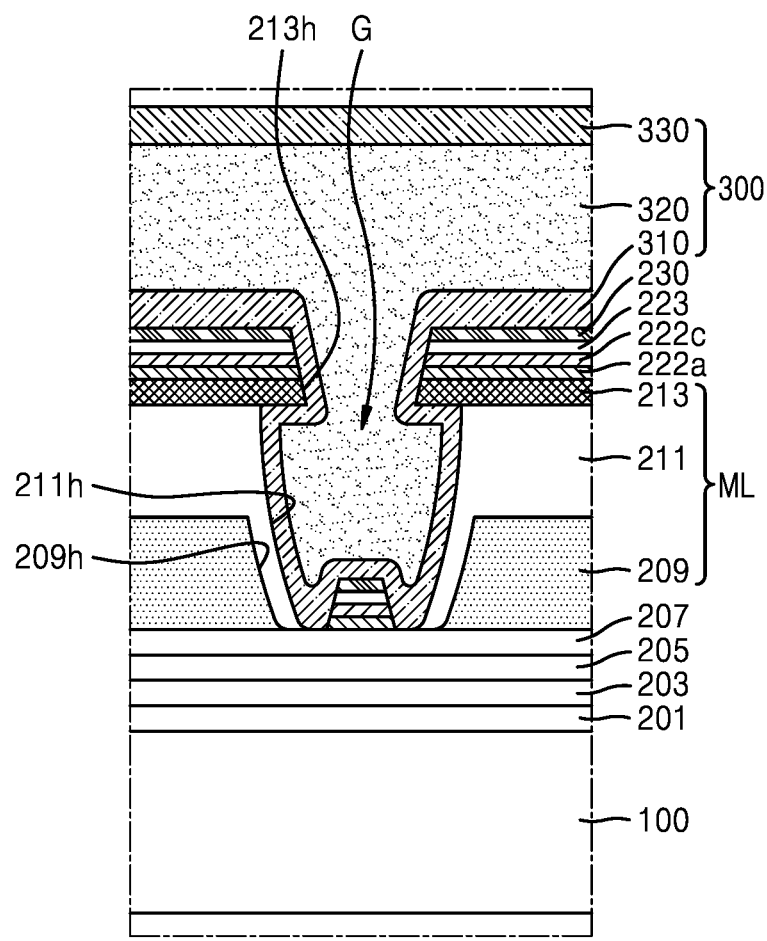

Thereafter, as shown in FIG. 12I, the first inorganic encapsulation layer 310, the organic encapsulation layer 320, and the second inorganic encapsulation layer 330 are sequentially formed to thereby cover and protect, for example, organic layers from contacting external air.

As such, since the groove G is formed together when the first and second organic insulating layers 209 and 211 and the passivation layer 212 are formed on the substrate 100, an additional process of forming the groove G may not be performed. Thus, a process may be simplified.

Accordingly, according, to the display apparatus and the method of manufacturing the same described above, a display apparatus including a component area in a display area may be implemented, and various types of components may be arranged in the component area. In addition, since a groove may be formed by performing a simple process, the groove may disconnect a moisture penetration path in a middle area that is a boundary between the component area and the display area in a periphery of the component area, and performance and productivity of a product may be increased.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A display apparatus comprising:
 a substrate comprising a component area, a display area, and a middle area provided between the component area and the display area;
 a thin-film transistor arranged in the display area;
 a display element comprising a pixel electrode, an intermediate layer, and an opposite electrode, wherein the pixel electrode is electrically connected to the thin-film transistor, wherein the intermediate layer is disposed on the pixel electrode, and wherein the opposite electrode is disposed on the intermediate layer;
 a first organic insulating layer, a second organic insulating layer, and a passivation layer sequentially stacked on each other between the thin-film transistor and the pixel electrode; and
 a groove arranged in the middle area, wherein the groove divides an organic material layer included in the intermediate layer,
 wherein the groove is provided in multiple layers comprising an organic layer and an inorganic layer, wherein the organic layer is arranged on the substrate, and the inorganic layer is stacked on the organic layer,
 wherein the organic layer and the inorganic layer are disposed below the opposite electrode, wherein the inorganic layer is a same layer as the passivation layer,
 wherein the groove does not vertically overlap the component area, and the groove partitions the first organic insulating layer, the second organic insulating layer, and the passivation layer,
 wherein the component area is an area in which a component is located,
 wherein the component includes at least one, of a sensor, a camera, a lamp, and a speaker.

2. The display apparatus of claim 1, wherein the inorganic layer comprises a portion protruding toward a center of the groove.

3. The display apparatus of claim 1, wherein the organic layer comprises a first sub-lower layer and a second sub-lower layer, wherein the first sub-lower layer is a same layer as the second organic insulating layer and the second sub-lower layer is a same layer as the first organic insulating layer.

4. The display apparatus of claim 3, wherein an end of the second sub-lower layer adjacent to the groove is covered by the first sub-lower layer.

5. The display apparatus of claim 1, further comprising a thin-film encapsulation layer covering the display area and the middle area on the substrate.

6. The display apparatus of claim 5, wherein the thin-film encapsulation layer comprises a first inorganic encapsulation layer, a second inorganic encapsulation layer, and an organic encapsulation layer arranged between the first inorganic encapsulation layer and the second inorganic encapsulation layer.

7. The display apparatus of claim 6, wherein the first inorganic encapsulation layer covers an inner wall of the groove that partitions the organic layer and the inorganic layer, wherein the organic encapsulation layer fills an inner space of the groove, and wherein the second inorganic encapsulation layer covers an upper surface of the organic encapsulation layer.

8. The display apparatus of claim 1, wherein the intermediate layer comprises a light-emitting layer, a hole transport layer, and an electron transport layer, wherein the light-emitting layer is disposed between the hole transport layer and the electron transport layer, and wherein the hole transport layer and the electron transport layer are extended and stacked on the inorganic layer.

9. The display apparatus of claim 8, wherein at least one of the hole transport layer or the electron transport layer is divided by the groove.

* * * * *